(12) United States Patent
Okuno et al.

(10) Patent No.: US 10,515,809 B2
(45) Date of Patent: Dec. 24, 2019

(54) SELECTIVE HIGH-K FORMATION IN GATE-LAST PROCESS

(71) Applicant: Taiwan Semiconductor Manufacturing Company, Ltd., Hsinchu (TW)

(72) Inventors: Yasutoshi Okuno, Hsinchu (TW); Teng-Chun Tsai, Hsinchu (TW); Ziwei Fang, Baoshan Township (TW); Fu-Ting Yen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/025,708

(22) Filed: Jul. 2, 2018

(65) Prior Publication Data

US 2019/0148151 A1    May 16, 2019

Related U.S. Application Data

(60) Provisional application No. 62/586,322, filed on Nov. 15, 2017.

(51) Int. Cl.
| | |
|---|---|
| *H01L 21/28* | (2006.01) |
| *H01L 29/49* | (2006.01) |
| *H01L 29/66* | (2006.01) |
| *H01L 29/78* | (2006.01) |
| *H01L 29/51* | (2006.01) |
| *H01L 21/8238* | (2006.01) |

(52) U.S. Cl.
CPC .. *H01L 21/28141* (2013.01); *H01L 21/28088* (2013.01); *H01L 21/823821* (2013.01); *H01L 29/4966* (2013.01); *H01L 29/4991* (2013.01); *H01L 29/517* (2013.01); *H01L 29/66545* (2013.01); *H01L 29/66795* (2013.01); *H01L 29/7851* (2013.01)

(58) Field of Classification Search
CPC ......... H01L 21/28141; H01L 29/66795; H01L 29/66545; H01L 29/4966; H01L 29/7851; H01L 29/4991; H01L 29/517
USPC ......... 438/230, 269, 300; 257/192, 369, 401
See application file for complete search history.

(56) References Cited

U.S. PATENT DOCUMENTS

| | | | |
|---|---|---|---|
| 7,276,775 B2 | 10/2007 | Bertin et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |

(Continued)

FOREIGN PATENT DOCUMENTS

| | | |
|---|---|---|
| KR | 20020070099 A | 9/2002 |
| KR | 20160028938 A | 3/2016 |
| WO | 2017111770 A1 | 6/2017 |

*Primary Examiner* — Thinh T Nguyen
(74) *Attorney, Agent, or Firm* — Slater Matsil, LLP

(57) ABSTRACT

A method includes removing a dummy gate stack to form an opening between gate spacers, selectively forming an inhibitor film on sidewalls of the gate spacers, with the sidewalls of the gate spacers facing the opening, and selectively forming a dielectric layer over a surface of a semiconductor region. The inhibitor film inhibits growth of the dielectric layer on the inhibitor film. The method further includes removing the inhibitor film, and forming a replacement gate electrode in a remaining portion of the opening.

20 Claims, 22 Drawing Sheets

(56) References Cited

U.S. PATENT DOCUMENTS

| | | |
|---|---|---|
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 9,887,129 B2 | 2/2018 | Hsieh et al. |
| 2013/0062702 A1* | 3/2013 | Cheng et al. ....... H01L 29/7833 438/230 |
| 2016/0211378 A1 | 7/2016 | Kim et al. |

* cited by examiner

SELECTIVE HIGH-K FORMATION IN GATE-LAST PROCESS

PRIORITY CLAIM AND CROSS-REFERENCE

This application claims the benefit of U.S. Provisional Application No. 62/586,322 filed on Nov. 15, 2017, entitled "Selective High-K Formation in Gate-Last Process," which application is hereby incorporated herein by reference.

BACKGROUND

Transistors are basic building elements in integrated circuits. In recent development of the integrated circuits, transistors adopt metal gates, which are typically formed in the form of replacement gates. The formation of the replacement gates typically involves forming dummy gate stacks, forming gate spacers on sidewalls of the dummy gate stacks, removing the dummy gate stacks to form openings between the gate spacers, depositing gate dielectric layers and metal layers into the openings, and then performing Chemical Mechanical Polish (CMP) to remove excess portions of the gate dielectric layers and the metal layers. The remaining portions of the gate dielectric layers and the metal layers are replacement gates. There are typically multiple sub-layers in the replacement gates. With the increasing down-scaling of integrated circuits, the widths of the replacement gates become increasingly smaller, making it more difficult to accommodate the multiple sub-layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1, 2, 3A, 3B, 4A, 4B, 5A, 5B, 6, 7, 8, 9A, 9B and 10 through 13A illustrate the cross-sectional views and perspective views of intermediate stages in the formation of Fin Field-Effect Transistors (FinFETs) in accordance with some embodiments.

DETAILED DESCRIPTION

Figure 1:
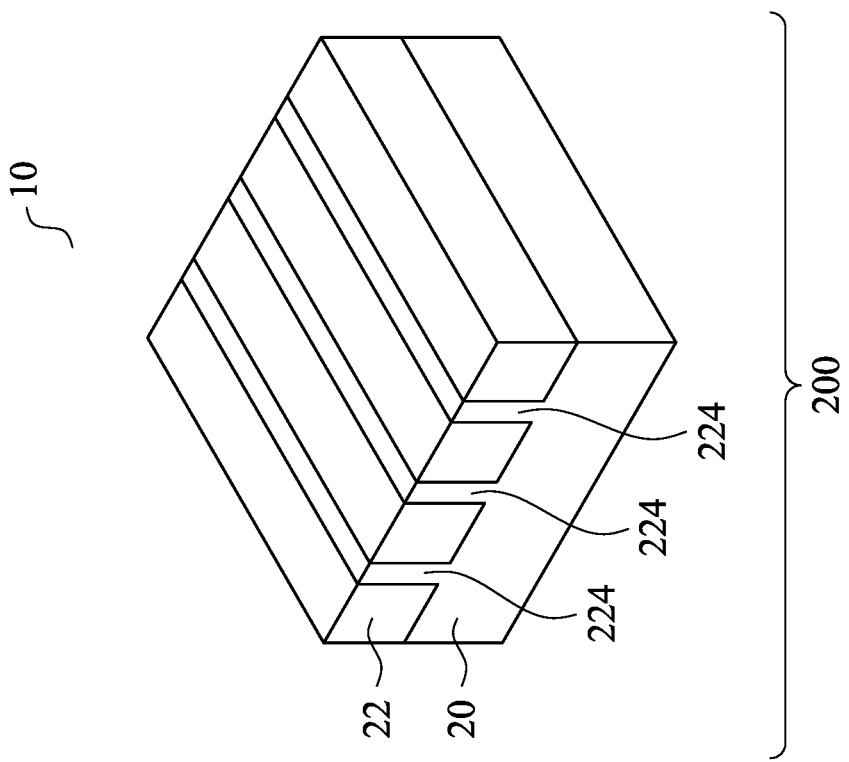
Figure 1:
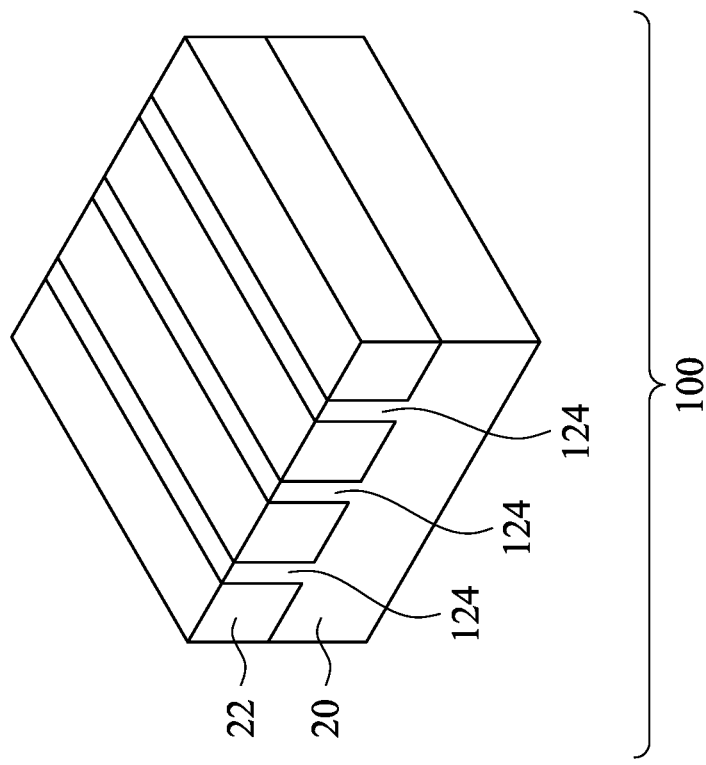

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistor and the methods of forming the same are provided in accordance with various exemplary embodiments. The intermediate stages of forming the transistors are illustrated in accordance with some embodiments. Some variations of some embodiments are discussed. Throughout the various views and illustrative embodiments, like reference numbers are used to designate like elements. In the illustrated exemplary embodiments, the formation of Fin Field-Effect Transistors (FinFETs) is used as an example to explain the concept of the present disclosure. Planar transistors may also adopt the embodiments of the present disclosure.

Figure 15:
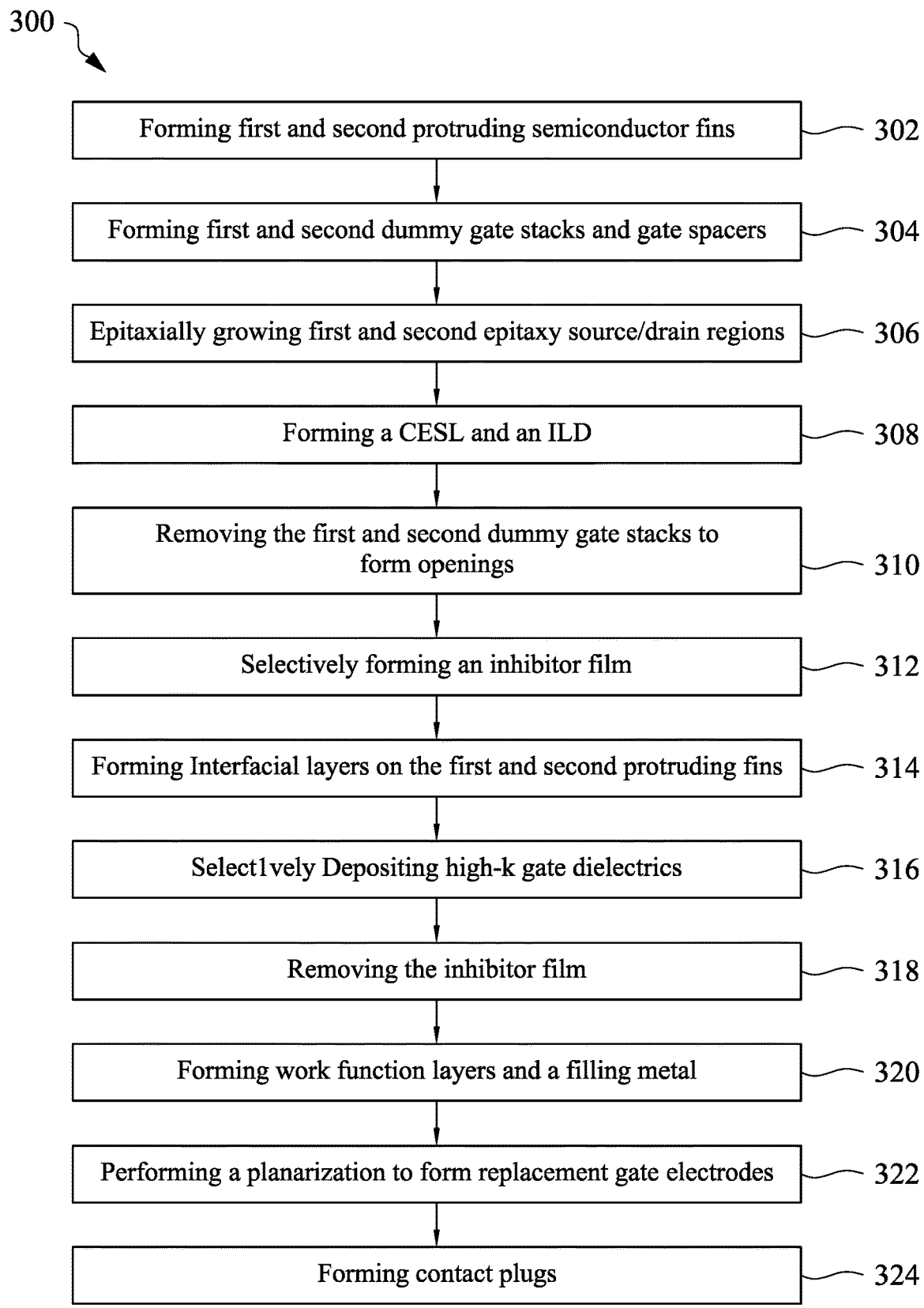
FIG. 15 illustrates a flow chart of a process for forming a FinFET in accordance with some embodiments.

FIGS. 1 through 13A illustrate the perspective views and cross-sectional views of intermediate stages in the formation of transistors in accordance with some embodiments of the present disclosure. The steps shown in FIGS. 1 through 13A are also reflected schematically in the process flow 300 shown in FIG. 15. The formed transistors include a p-type transistor (such as a p-type FinFET) and an n-type transistor (such as an n-type FinFET) in accordance with some exemplary embodiments.

FIG. 1 illustrates a perspective view of an initial structure. The initial structure includes wafer 10, which further includes substrate 20. Substrate 20 may be a semiconductor substrate, which may be a silicon substrate, a silicon germanium substrate, or a substrate formed of other semiconductor materials. In accordance with some embodiments of the present disclosure, substrate 20 includes a bulk silicon substrate and an epitaxy silicon germanium (SiGe) layer or a germanium layer (without silicon therein) over the bulk silicon substrate. Substrate 20 may be doped with a p-type or an n-type impurity. Isolation regions 22 such as Shallow Trench Isolation (STI) regions may be formed to extend into substrate 20. The portions of substrate 20 between neighboring STI regions 22 are referred to as semiconductor strips 124 and 224, which are in device regions 100 and 200, respectively. Device region 100 is a p-type transistor region, in which a p-type transistor such as a p-type FinFET is to be formed. Device region 200 is an n-type transistor region, in which an n-type transistor such as an n-type FinFET is to be formed.

STI regions 22 may include a liner oxide (not shown). The liner oxide may be formed of a thermal oxide formed through a thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). STI regions 22 may also include a dielectric material over the liner oxide, and the dielectric material may be formed using Flowable Chemical Vapor Deposition (FCVD), spin-on coating, or the like.

Figure 2:
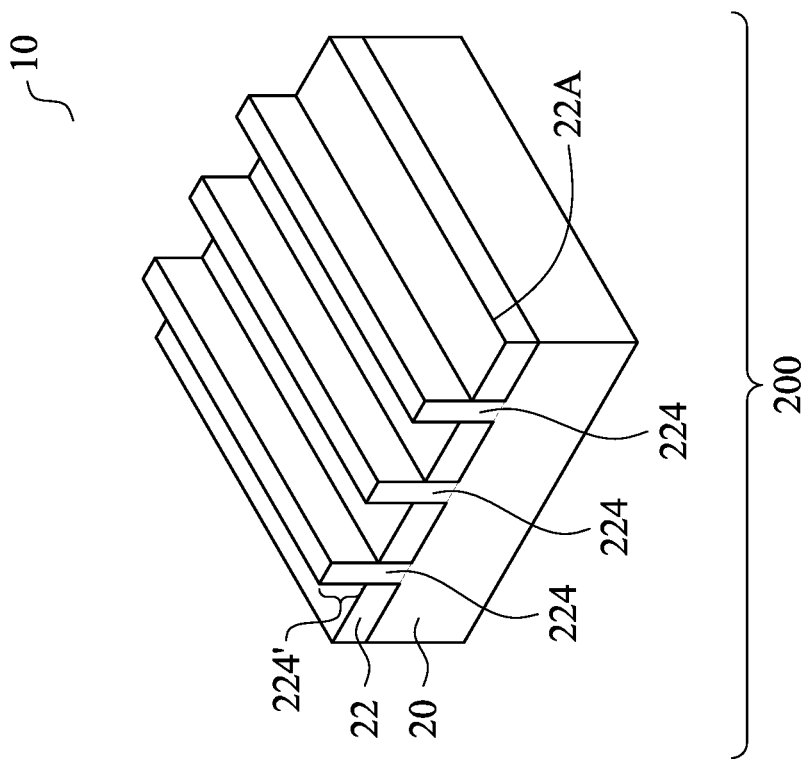
Figure 2:
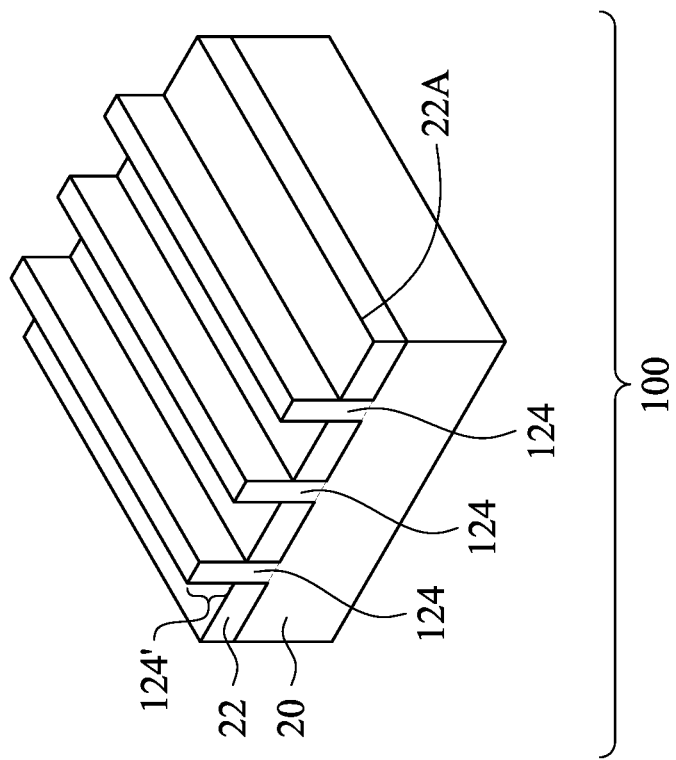

Referring to FIG. 2, STI regions 22 are recessed, so that the top portions of semiconductor strips 124 and 224 protrude higher than the top surfaces 22A of the neighboring STI regions 22 to form protruding fins 124' and 224'. The respective step is illustrated as step 302 in the process flow shown in FIG. 15. The etching may be performed using a dry etching process, wherein $NH_3$ and $NF_3$ are used as the etching gases. During the etching process, plasma may be generated. Argon may also be included. In accordance with alternative embodiments of the present disclosure, the recessing of STI regions 22 is performed using a wet etch process. The etching chemical may include diluted HF, for example.

In above-illustrated exemplary embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

The materials of protruding fins 124' and 224' may also be replaced with materials different from that of substrate 20. For example, protruding fins 124' may be formed of Si, SiP, SiC, SiPC, or a III-V compound semiconductor such as InP, GaAs, AlAs, InAs, InAlAs, InGaAs, or the like. Protruding fins 224' may be formed of Si, SiGe, SiGeB, Ge, or a III-V compound semiconductor such as InSb, GaSb, InGaSb, or the like.

Figure 3A:
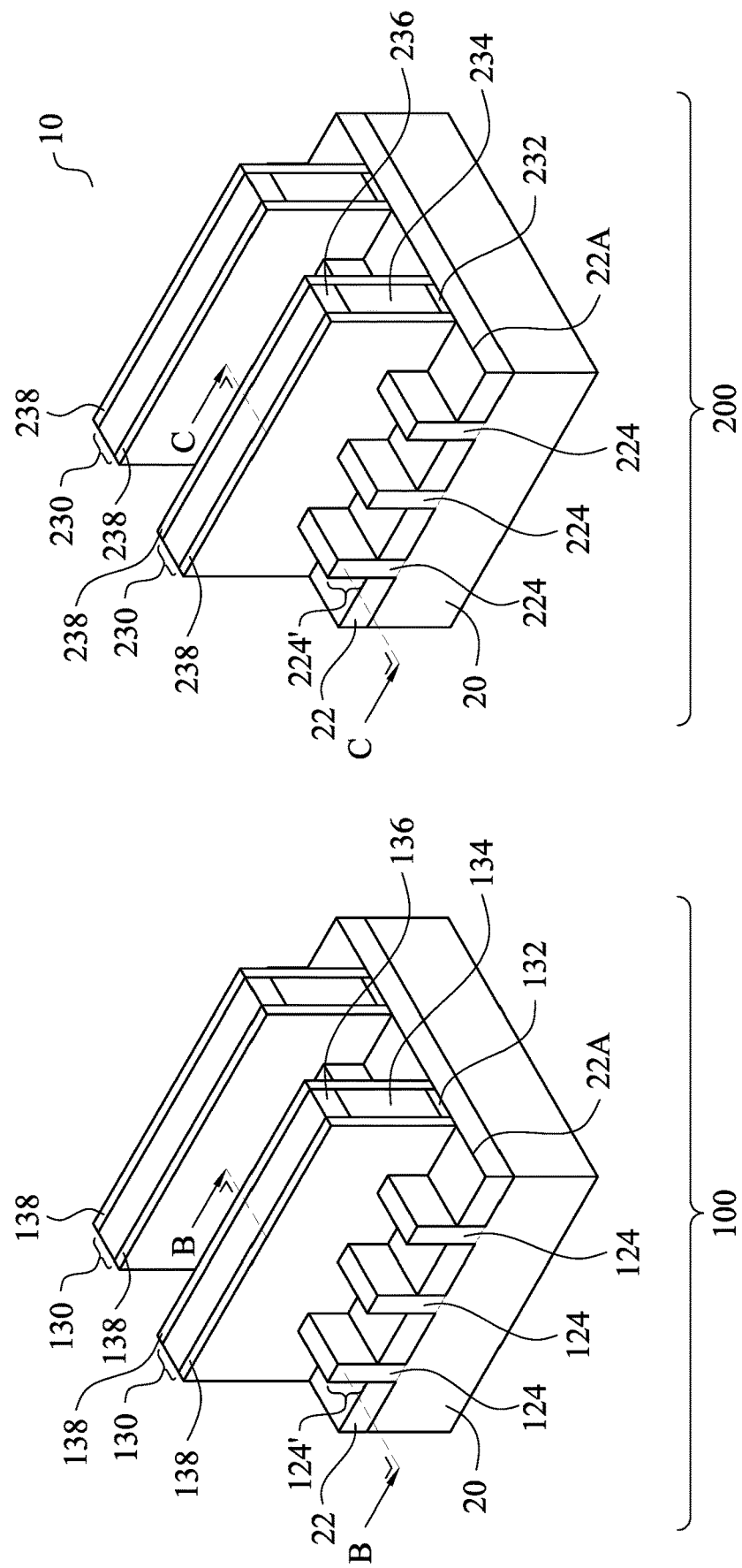

Referring to FIG. 3A, dummy gate stacks 130 and 230 are formed on the top surfaces and the sidewalls of protruding fins 124' and 224', respectively. The respective step is illustrated as step 304 in the process flow shown in FIG. 15. Dummy gate stacks 130 may include gate dielectrics 132 and dummy gate electrodes 134 over dummy gate dielectrics 132. Dummy gate stacks 230 may include gate dielectrics 232 and dummy gate electrodes 234 over dummy gate dielectrics 232. Dummy gate electrodes 134 and 234 may be formed, for example, using polysilicon, and other materials may also be used. Each of dummy gate stacks 130 and 230 may also include one (or a plurality of) hard mask layers 136 and 236. Hard mask layers 136 and 236 may be formed of SiN, SiO, SiC, SiOC, SiON, SiCN, SiOCN, TiN, AlON, $Al_2O_3$, or the like. The thickness of hard mask layers 136 and 236 may be in the range between about 10 nm and about 60 nm. Each of dummy gate stacks 130 and 230 crosses over a single one or a plurality of protruding fins 124' and 224', respectively. Dummy gate stacks 130 and 230 may also have lengthwise directions perpendicular to the lengthwise directions of the respective protruding fins 124' and 224', respectively.

Figure 3B:
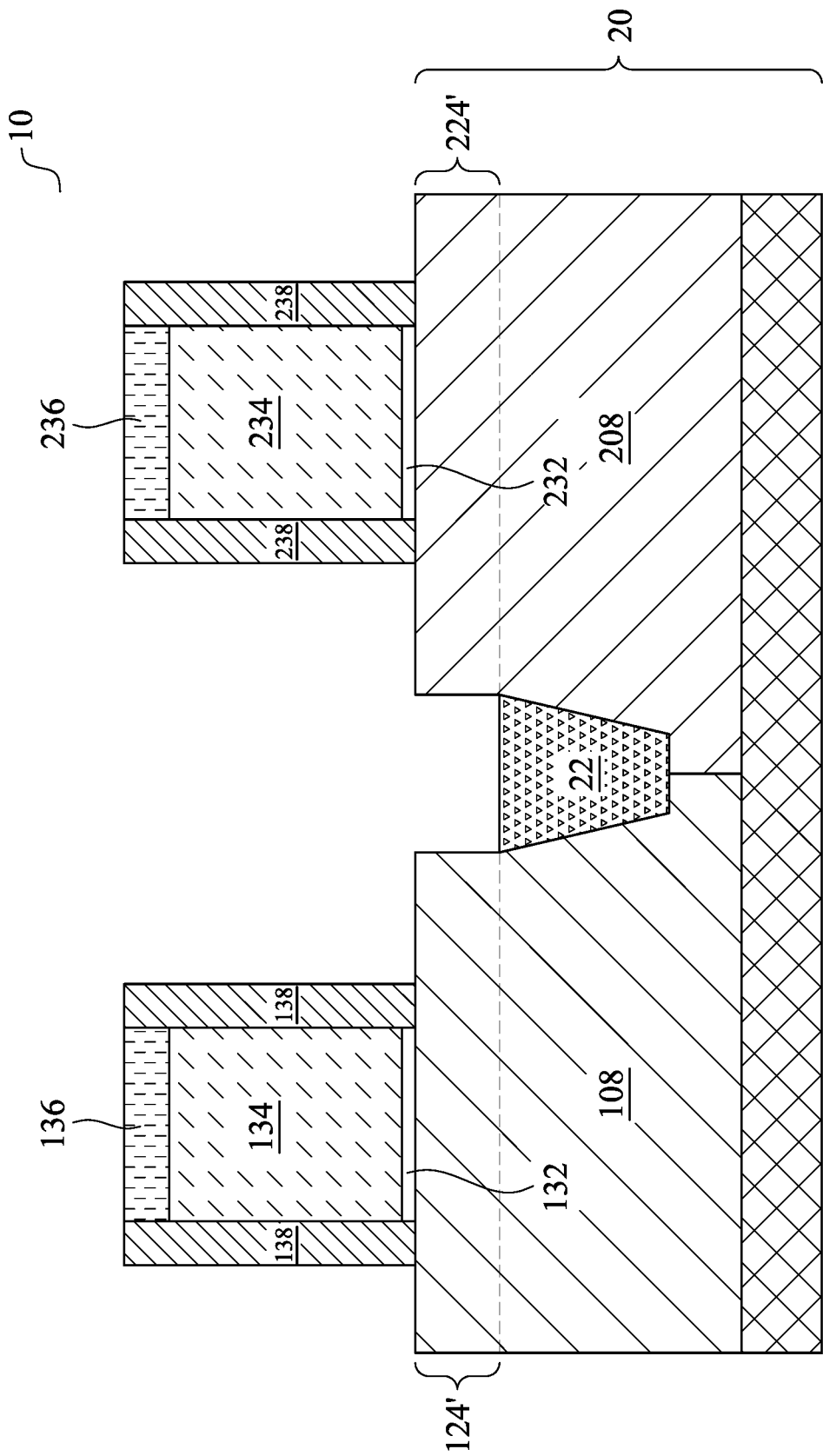

FIG. 3B illustrates a cross-sectional view of device regions 100 and 200 in accordance with some embodiments. The cross-sectional view combines the cross-sectional view obtained from the vertical plane containing line B-B in FIG. 3A and the cross-sectional view obtained from the vertical plane containing line C-C in FIG. 3A, with an STI region 22 separating device regions 100 and 200 in FIG. 3B. Protruding fins 124' and 224' are illustrated schematically. Also, n-well region 108 and p-well region 208 are formed to extend into protruding fins 124' and 224', respectively. N-well region 108 and p-well region 208 may also extend into the bulk portion of semiconductor substrate 20 lower than protruding fins 124' and 224'. Unless specified otherwise, the cross-sectional views in subsequent figures (except FIGS. 9B and 15) may also be obtained from planes same as the vertical planes as shown in FIG. 3A, which planes contain lines B-B and C-C, respectively.

Next, as also shown in FIGS. 3A and 3B, gate spacers 138 and 238 are formed on the sidewalls of dummy gate stacks 130 and 230, respectively. The respective step is also illustrated as step 304 in the process flow shown in FIG. 15. In the meantime, fin spacers (not shown) may also be formed on the sidewalls of protruding fins 124' and 224'. In accordance with some embodiments of the present disclosure, gate spacers 138 and 238 are formed of an oxygen-containing dielectric material(s) such as silicon oxynitride (SiON), silicon oxy-carbo-nitride (SiOCN), silicon oxide ($SiO_2$), silicon oxycarbide (SiOC), or the like. Non-oxygen-containing materials such as silicon nitride (SiN) and/or silicon carbide (SiC) may also be used to form gate spacers 138 and 238, depending on the formation method of the subsequently formed inhibitor film. Gate spacers 138 and 238 may include air-gaps, or may formed as including pores, and may have a single-layer structure or a multi-layer structure including a plurality of dielectric layers.

Figure 4A:
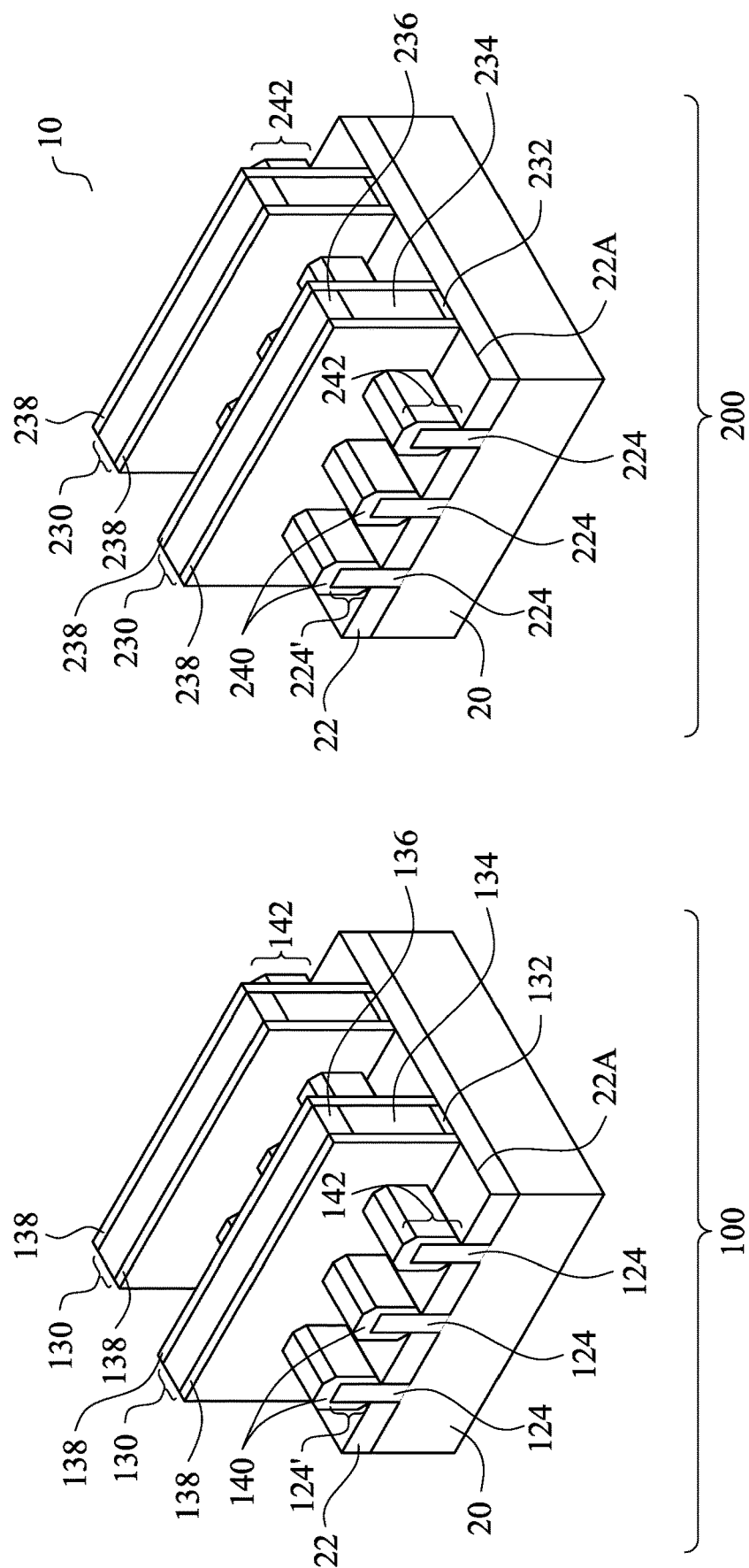
Figure 4B:
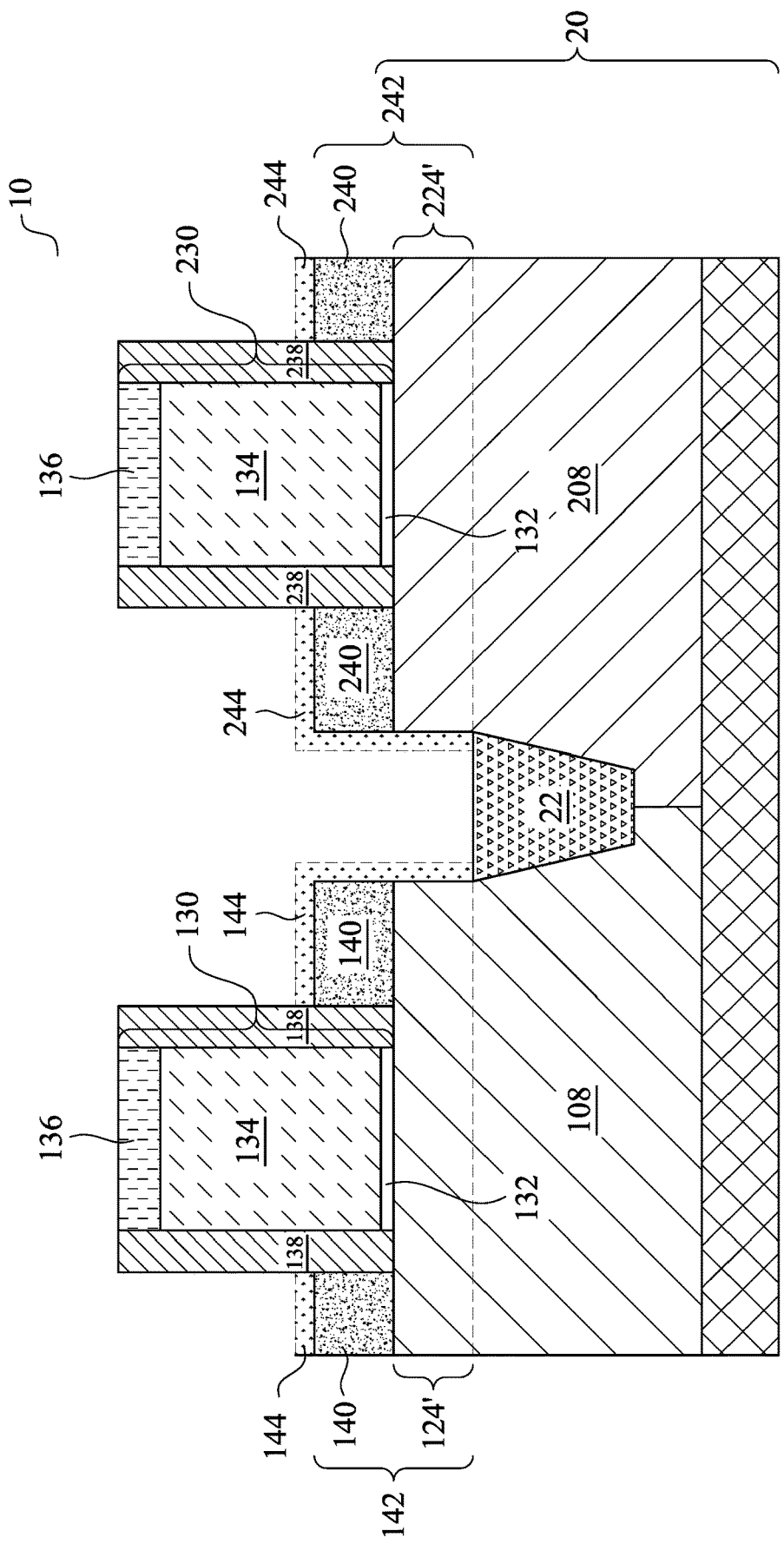

FIGS. 4A and 4B illustrate the formation of source/drain regions 142 and 242 in device regions 100 and 200, respectively. In accordance with some embodiments of the present disclosure, epitaxy regions 140 and 240 are grown on protruding fins 124' and 224', respectively, forming cladding source/drain regions. The respective step is illustrated as step 306 in the process flow shown in FIG. 15. Epitaxy regions 140 and 240 may be doped with a p-type impurity and an n-type impurity, respectively, which may be in-situ doped with the proceeding of the epitaxy. In accordance with some embodiments of the present disclosure, epitaxy regions 140 includes Si, SiGe, SiGeB, Ge or a III-V compound semiconductor such as InSb, GaSb, InGaSb, or the like. Epitaxy regions 240 may include Si, SiP, SiC, SiPC, or a III-V compound semiconductor such as InP, GaAs, AlAs, InAs, InAlAs, InGaAs, or the like. The thickness of epitaxy regions 140 and 240 may be in the range between about 3 nm and about 30 nm.

After the epitaxy step, epitaxy regions and protruding fin 124' may be further implanted with a p-type impurity to form source and drain regions 142. Epitaxy regions 240 and protruding fins 224' may be further implanted with an n-type impurity to form source and drain regions 242. In accordance with alternative embodiments of the present disclosure, the implantation steps are skipped, for example, when epitaxy regions 140 and 240 have been in-situ doped with the p-type and n-type impurities, respectively.

In accordance with some embodiments of the present disclosure, instead of forming cladding source/drain regions, an etching step (referred to as source/drain recessing hereinafter) is performed to etch the portions of protruding fins 124' and 224' that are not covered by dummy gate stack 130/230 and gate spacers 138/238. The etching may be anisotropic, and hence the portions of fins 124' and 224' directly underlying dummy gate stacks 130 and 230 and gate spacers 138 and 238 are protected, and are not etched. Recesses (not shown) are accordingly formed between STI regions 22. Epitaxy source/drain regions are then grown from the recesses.

FIG. 4B also schematically illustrates source/drain silicide regions 144 and 244 respectively, which may be formed by depositing a blanket metal layer, performing an anneal to react the blanket metal layer with source/drain regions 142 and 242, and removing the un-reacted portions of the metal layer. The metal for forming source/drain silicide regions 144 and 244 may include Ti, Co, Ni, NiCo, Pt, NiPt, Ir, PtIr, Er, Yb, Pd, Rh, Nb, or the like. In accordance with alternative embodiments, source/drain silicide regions are formed after the formation of replacement metal gates, and are formed through contact openings, which penetrate through Inter-Layer Dielectric (ILD), as shown in FIGS. 13A, 13B, 13C, and 13D. Accordingly, in FIG. 4B, source/drain silicide regions 144 and 244 are illustrated using dashed lines to indicate they may or may not be formed at this time. In subsequent drawings, source/drain silicide regions 144 and 244 are not illustrated.

Figure 5A:
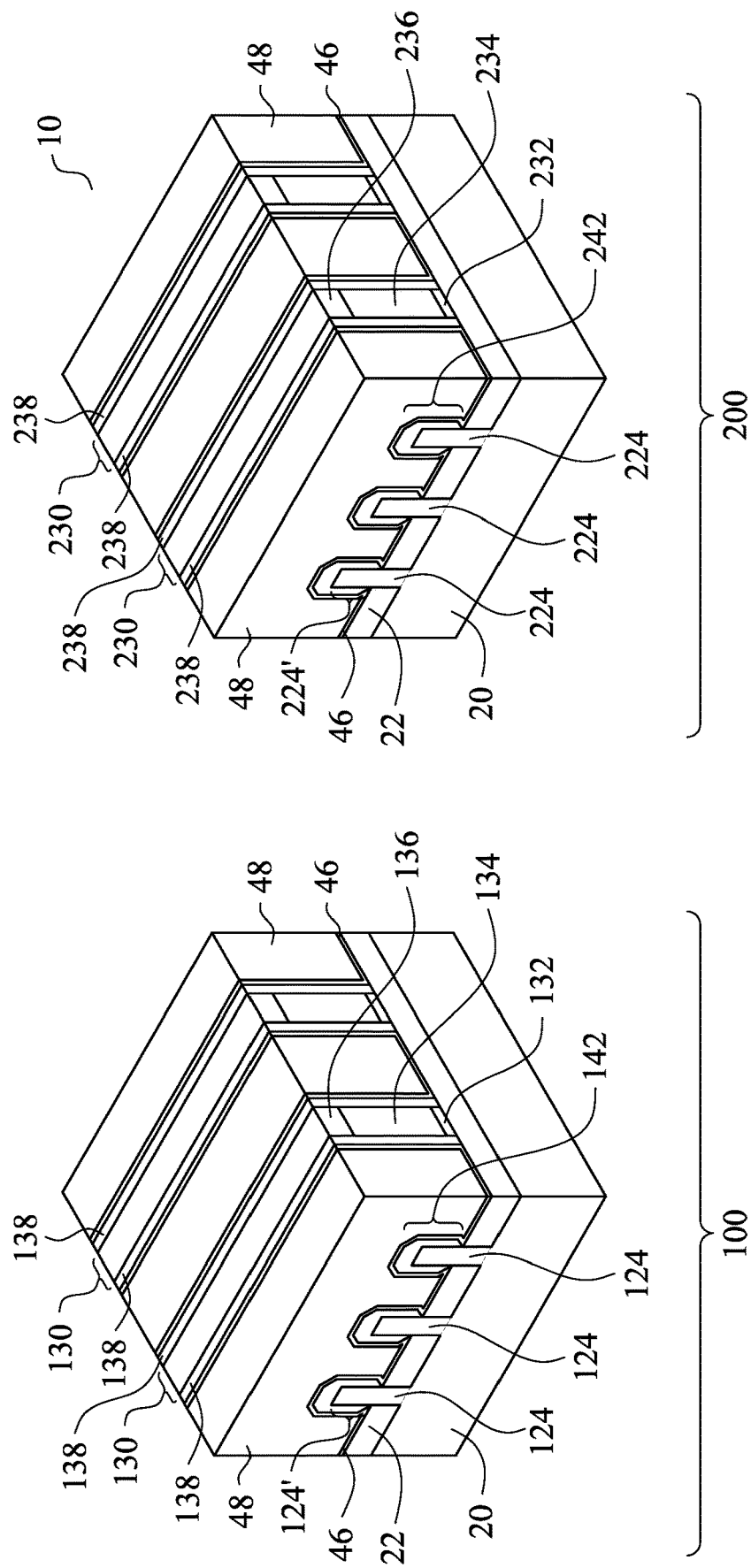
Figure 5B:
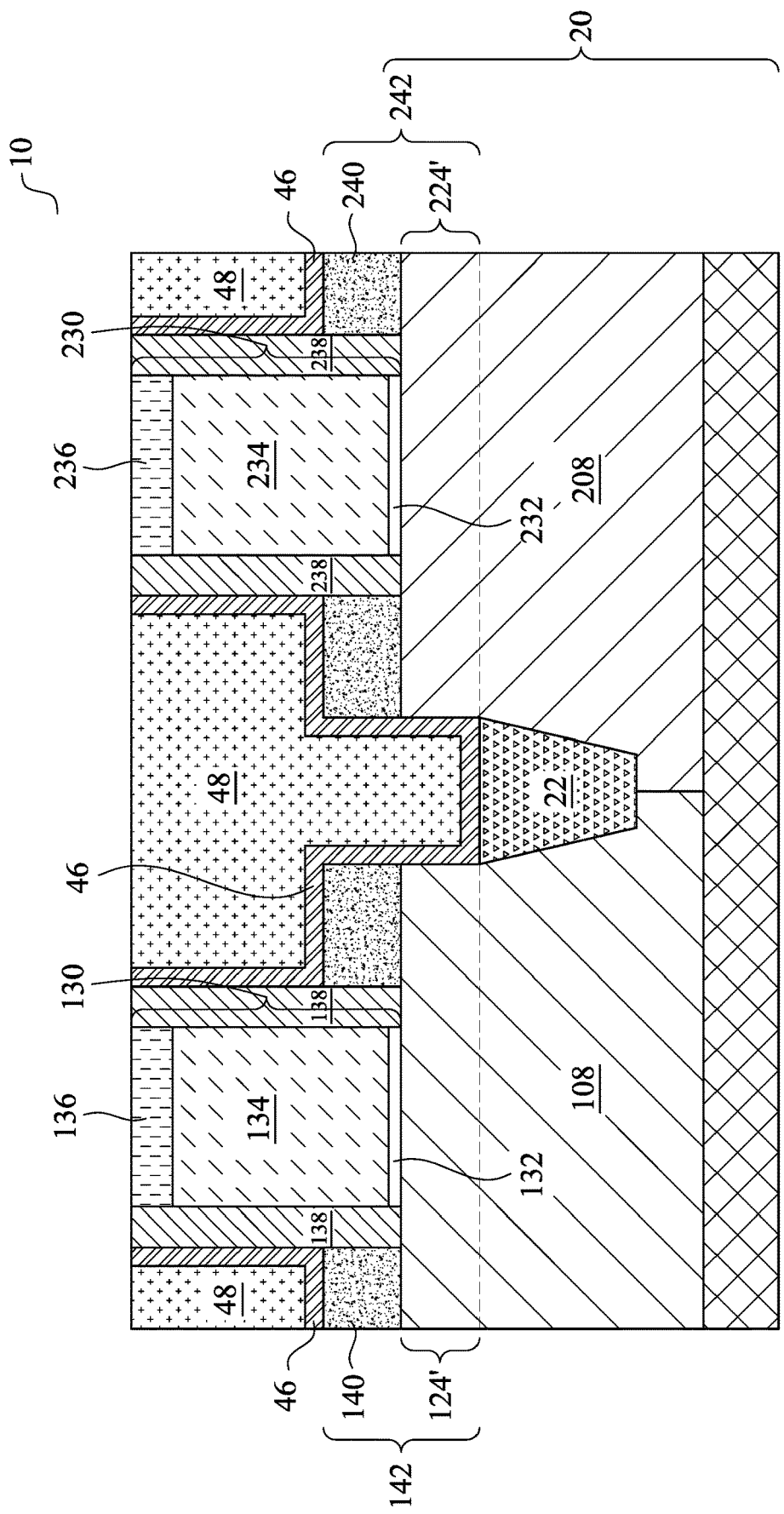

Contact Etch Stop Layer (CESL) 46 and Inter-Layer Dielectric (ILD) 48 are then formed, as shown in FIGS. 5A and 5B, which illustrate a perspective view and a cross-sectional view, respectively. The respective step is illustrated as step 308 in the process flow shown in FIG. 15. CESL 46 may be formed of SiN, SiCN, SiOC, SiON, SiCN, SiOCN, or the like. In accordance with some embodiments of the present disclosure, CESL 46 may include or may be free from oxygen therein. CESL 46 may be formed using a conformal deposition method such as ALD or CVD, for example. ILD 48 may include a dielectric material formed using, for example, FCVD, spin-on coating, CVD, or another deposition method. ILD 48 may also be formed of an oxygen-containing dielectric material, which may be silicon-oxide (SiO) based or silicon-oxycarbide (SiOC) based such as Tetra Ethyl Ortho Silicate (TEOS) oxide, Plasma-Enhanced CVD (PECVD) oxide ($SiO_2$), Phospho-Silicate Glass (PSG), Boro-Silicate Glass (BSG), Boron-Doped Phospho-Silicate Glass (BPSG), or the like. A planarization step such as Chemical Mechanical Polish (CMP) or mechanical grinding may be performed to level the top surfaces of ILD 48, dummy gate stacks 130 and 230, and gate spacers 138 and 238 with each other.

Figure 6:
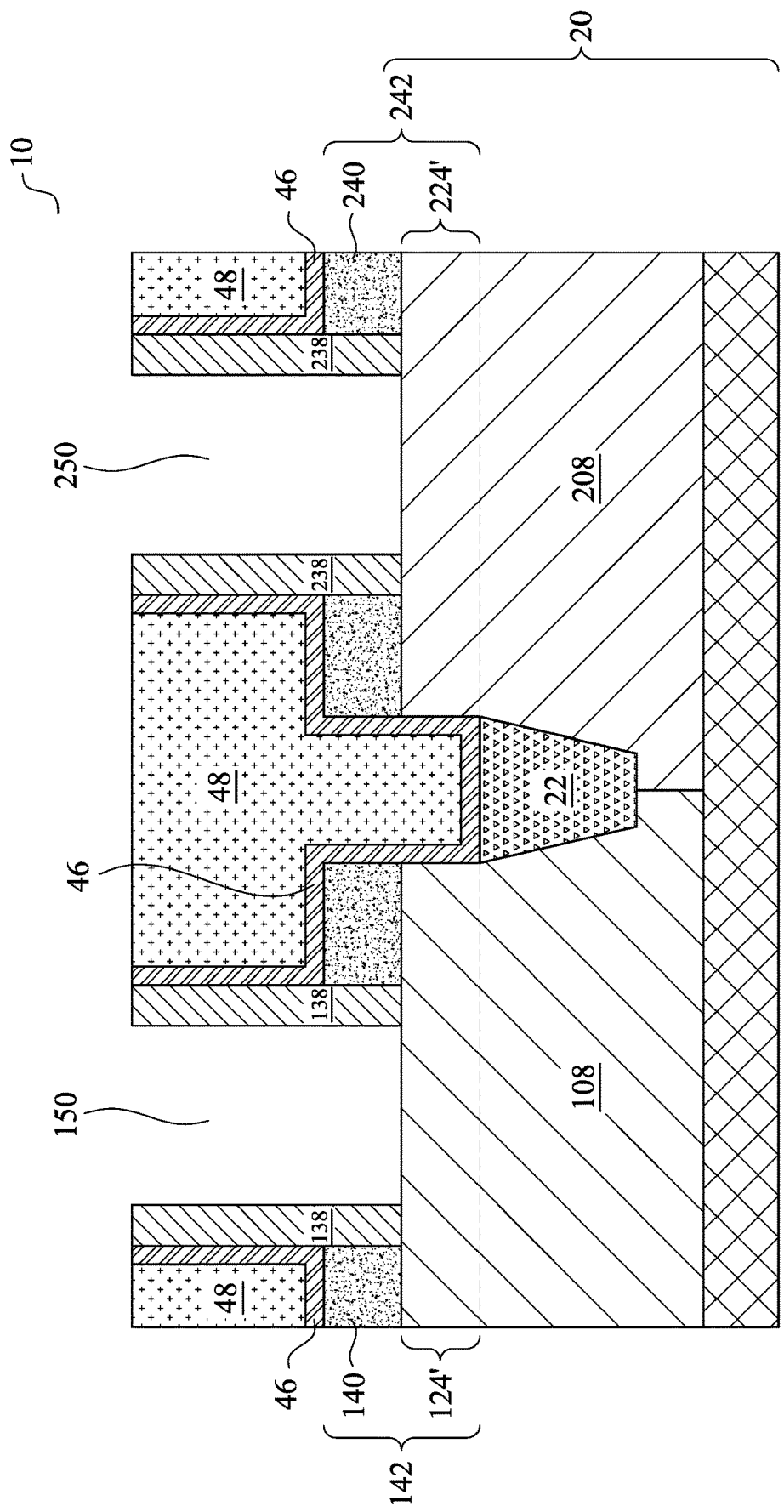

Next, dummy gate stacks 130 and 230, which include hard mask layers 136 and 236, dummy gate electrodes 134 and 234, and dummy gate dielectrics 132 and 232, are removed, forming openings 150 and 250, respectively, as shown in FIG. 6. The respective step is illustrated as step 310 in the process flow shown in FIG. 15. The surfaces of protruding fins 124' and 224' are exposed. FIG. 6 illustrates the exposure of the top surfaces of protruding fins 124' and 224'. The sidewalls surfaces of protruding fins 124' and 224' are also exposed to openings 150 and 250. Next, a cleaning step is performed to clean the surfaces of protruding fins 124' and 224' to remove native oxide. The cleaning may be performed, for example, using diluted HF solution.

Figure 7:
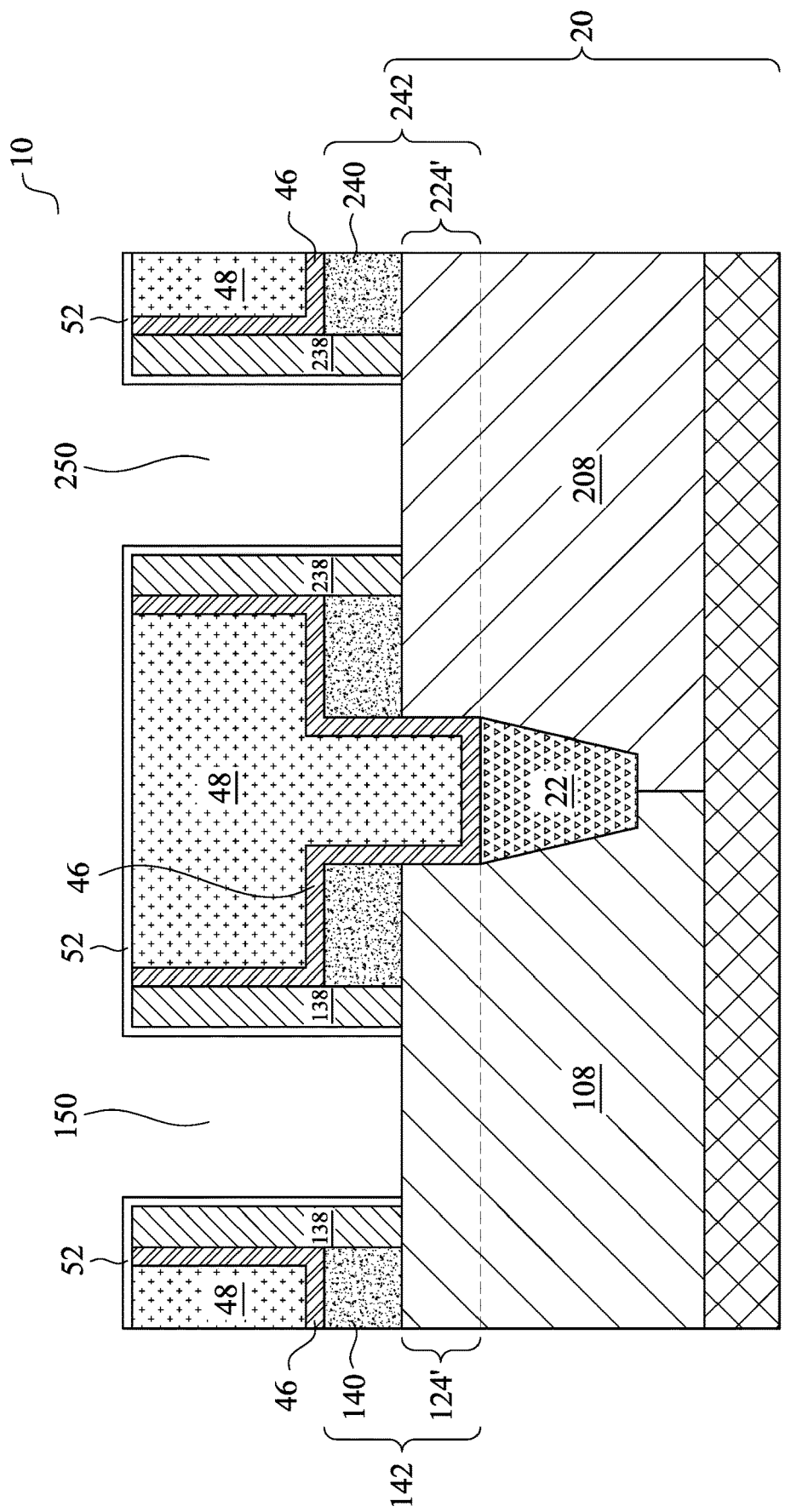

FIG. 7 illustrates the selective formation of inhibitor film 52. The respective step is illustrated as step 312 in the process flow shown in FIG. 15. In accordance with some embodiments of the present disclosure, inhibitor film 52 is formed through a deposition process, in which wafer 10 is exposed to a process gas (precursor) in order to have the inhibitor film deposited thereon. The deposition is performed without turning on plasma. The deposition temperature may be in the range between about 50° C. and about 300° C., or in the range between about 50° C. and about 200° C., depending on the process gas. The deposition time may be in the range between about 30 seconds and about 60 minutes. In the deposition, the flow rate of the process gas may be in the range between about 500 sccm and about 10,000 sccm. The pressure of the process chamber in which inhibitor film 52 is formed may be in the range between about 0.5 mTorr and about 100 mTorr. The process gas may include a Si—Cl based process gas including Octadecyl-trichlorosilane ($CH_3(CH_2)_{17}SiCl_3$), Trichloro (1H,1H,2H, 2H-perfluorooctyl) silane ($CF_3(CF_2)_5(CH_2)_2SiCl_3$), Dimethyl dichlorosilane (($CH_3)_2SiCl_2$), or combinations thereof. Alternatively or additionally, the process gas may include a Si—N based process gas including (Dimethylamino)trimethylsilane (($CH_3)_2NSi(CH_3)_3$), 1-(Trimethylsilyl)pyrrolidine (($CH_3)_3Si$—$NC_4H_8$), Hexamethyl disilazane ($[(CH_3)_3Si]_2NH$), Bis(dimethylamino)dimethylsilane ($[(CH_3)_2N]_2Si(CH_3)_2$), or the combinations thereof.

In accordance with alternative embodiments of the present disclosure, inhibitor film 52 is formed by soaking wafer 10 in a chemical solution, in which one or more of the above-discussed Si—Cl based process gas or Si—N based process gas is dissolved in a solvent. The solvent may include acetone or Isopropyl alcohol (IPA). In some other embodiments, the solvent may include demineralized water. The soaking time may be in the range between about 30 seconds and about 60 minutes.

In accordance with some embodiments of the present disclosure, oxides, which may be comprised in IL 54, gate spacers 138/238, and ILD 48, have OH bonds at their surfaces, and the OH bonds include negatively charged oxygen (O) bonded to positively charged hydrogen (H). When the Si—Cl based precursor or Si—N based precursor are used, since nitrogen (N) and chlorine (Cl) have high electronegativity values, they can easily bonded with hydrogen. Accordingly, in the formation of inhibitor film 52, the OH bonds and Si—N (or Si—Cl) bonds are broken, and the silicon in the precursor is bonded with the oxygen, and the functional groups in the precursor are accordingly attached to the oxygen in the underlying layer such as IL 54, gate spacers 138/238, and ILD 48. The respective process for attaching the bonds is a silylation process. The hydrogen and Cl (or N) are bonded, and are evacuated. On protruding fins 124' and 224', however, no OH bonds exist, and such reaction does not occur on protruding fins 124' and 224' even though protruding fins 124' and 224' are also exposed to the same precursor. Accordingly, inhibitor film 52 is formed on the top surfaces and sidewalls of gate spacers 138 and 238, and the top surfaces of ILD 48. Also, inhibitor film 52 is formed on the top surfaces of STI regions 22, as is illustrated in FIG. 9B, which illustrates a cross-sectional view obtained from a vertical plane cutting through protruding fin 124' or 224' in the lengthwise direction of the protruding fin. Inhibitor film 52 may be, or may not be, formed on the top surfaces of CESL 46. Regardless of whether inhibitor film 52 is formed on CESL 46, the resulting structure will not be affected since the portions (if any) of inhibitor film 52 on the top surfaces of CESL 46 will be removed in subsequent planarization process. Inhibitor film 52 may have a thickness in the range between about 0.3 nm and about 2 nm.

In the formation of inhibitor film 52, the silicon atoms in the precursor (gas or solution) may form bonds with the oxygen atoms in gate spacers 138/238, ILD 48, STI regions 32 (FIG. 9B), and possibly CESL 46. Inhibitor film 52 is thus grown. On the other hand, no bond is formed between the precursor and protruding fins 124' and 224'. Accordingly, inhibitor film 52 is selectively form on gate spacers 138/238, ILD 48, STI regions 22, and possibly CESL 46, but not on protruding fins 124' and 224'. In accordance with some embodiments, to ensure that inhibitor film 52 is not formed on the protruding fins 124' and 224', oxide cannot be present on the surfaces of protruding fins 124' and 224' at the starting time inhibitor film 52 is grown. Otherwise, inhibitor film 52 may also be grown on protruding fins 124' and 224'. Accordingly, in a period of time after (and including) protruding fins 124' and 224' are cleaned to remove oxide and before (and including) inhibitor film 52 is formed, wafer 10 is not exposed to substances that will cause oxide to be formed on protruding fins 124' and 224'. For example, wafer 10 is not exposed to open air, oxygen ($O_2$), ozone ($O_3$), water, etc. Depending on the composition of the precursor, inhibitor film 52 may include Si, C, H, and may or may not include Cl. Also, inhibitor film 52 may be an organic film, and may include functional groups $CH_3$, $CH_2$, $CF_2$, or the combinations thereof. Inhibitor film 52 may also include a carbon chain (and the chain of $CH_3$), in which a plurality of carbon atoms (such as about 2 to 20 carbon atoms) are connected to form the chain. Nitrogen (N) and chlorine (Cl) may be broken from precursor, and may not be included in inhibitor film 52. Accordingly, even if N and Cl are in inhibitor film 52, the percentage of N and Cl in inhibitor film 52 will be low.

Figure 8:
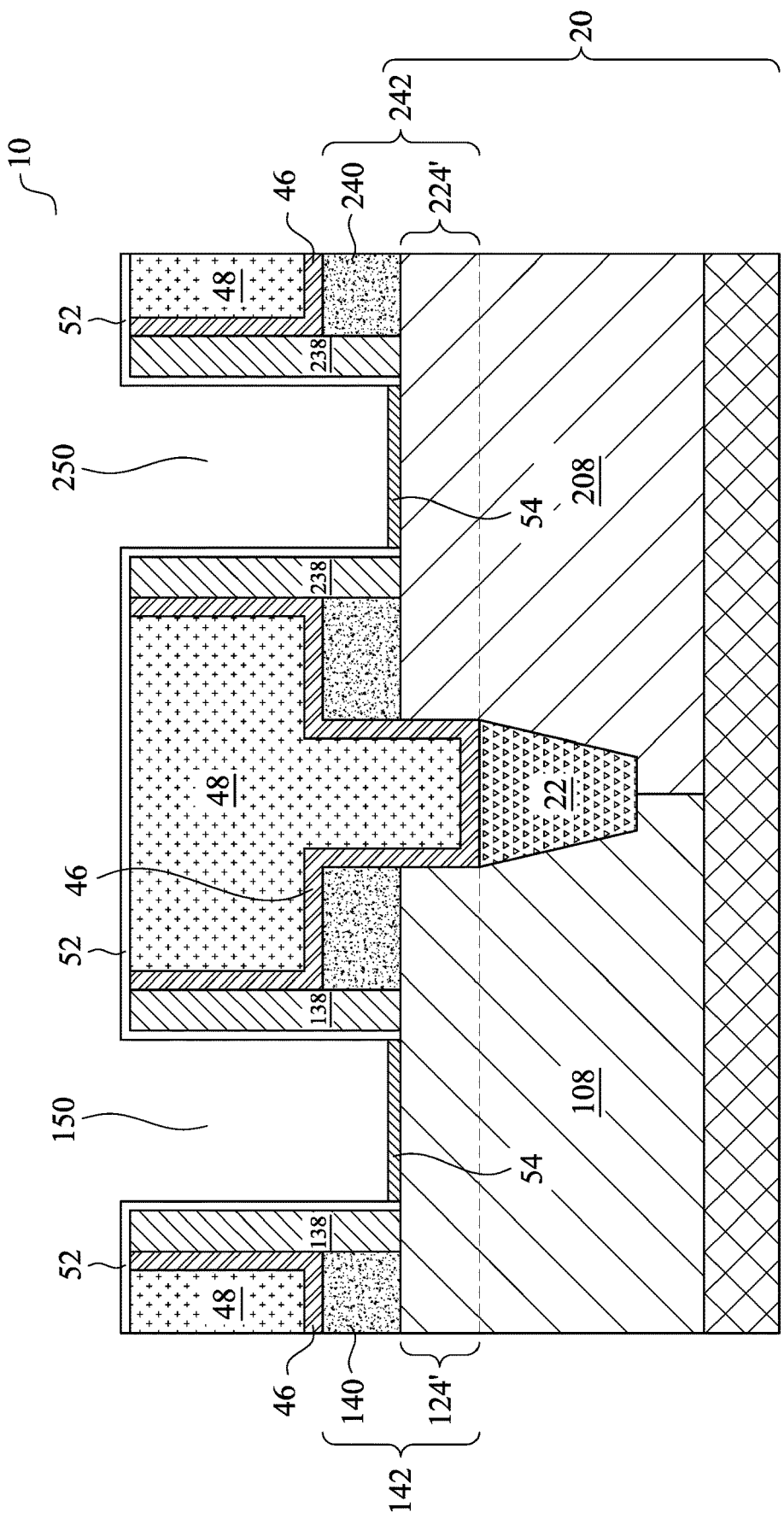

FIG. 8 illustrates the formation of Interfacial Layer (IL) 54, which includes silicon oxide such as $SiO_2$. The respective step is illustrated as step 314 in the process flow shown in FIG. 15. In accordance with some embodiments of the present disclosure, IL 54 is a chemical oxide layer formed by treating wafer 10 in a mixture of $NH_4OH$ and $H_2O_2$ (and/or $H_2O$), a mixture of HCl and $H_2O_2$ (and/or $H_2O$), a mixture of $H_2SO_4$ and $H_2O_2$, or the like. Through the chemical treatment, silicon oxide is formed on the surfaces of protruding fins 124' and 224' due to the reaction of the surface material of protruding fins 124' and 224' with the chemical solution. The thickness of IL 54 may be in the range between about 0.2 nm and about 2 nm. In accordance with some embodiments of the present disclosure, the treatment using the chemical solution is performed ex-situ with the subsequent formation of high-k gate dielectric.

In accordance with alternative embodiments of the present disclosure, IL 54 is a thermal oxide layer formed by thermally treating wafer 10 in an oxygen-containing process gas such as $O_2$, $O_3$, a mixture of $O_2$ and $O_3$, or a mixture of $O_3$ and water steam ($H_2O$). Through the treatment, silicon oxide is formed on the surfaces of protruding fins 124' and 224' due to the oxidation of the surface material of protruding fins 124' and 224'. The temperature may be higher than about 150° C., higher than about 200° C., or higher than about 300° C. An example range of the temperature is between about 150° C. and about 300° C. It is appreciated that inhibitor film 52 may be damaged at a temperature higher than about 200° C. or 300° C., depending on the composition of inhibitor film 52. To avoid the damage of inhibitor film 52, the thermal oxide of IL 54 is formed at a temperature that can be endured by inhibitor film 52 without causing it to be damaged. In accordance with some embodiments of the present disclosure, the thermal treatment for forming IL 54 is performed in-situ with the subsequent formation of high-k gate dielectric, and may be performed in the same process chamber for forming the high-k gate dielectric, so that manufacturing cost is reduced. In accordance with yet alternative embodiments of the present disclosure, IL 54 is formed by performing the chemical treatment first, followed by a thermal treatment, with the precursors of the chemical treatment and the thermal treatment being similar to what are discussed in preceding paragraphs.

In above-discussed embodiments, inhibitor film 52 is formed before the formation of IL 54. This order cannot be reversed. Otherwise, inhibitor film 52 will also be formed on IL 54, and the subsequently formed high-k dielectric layer will not extend on IL 54.

Figure 9A:
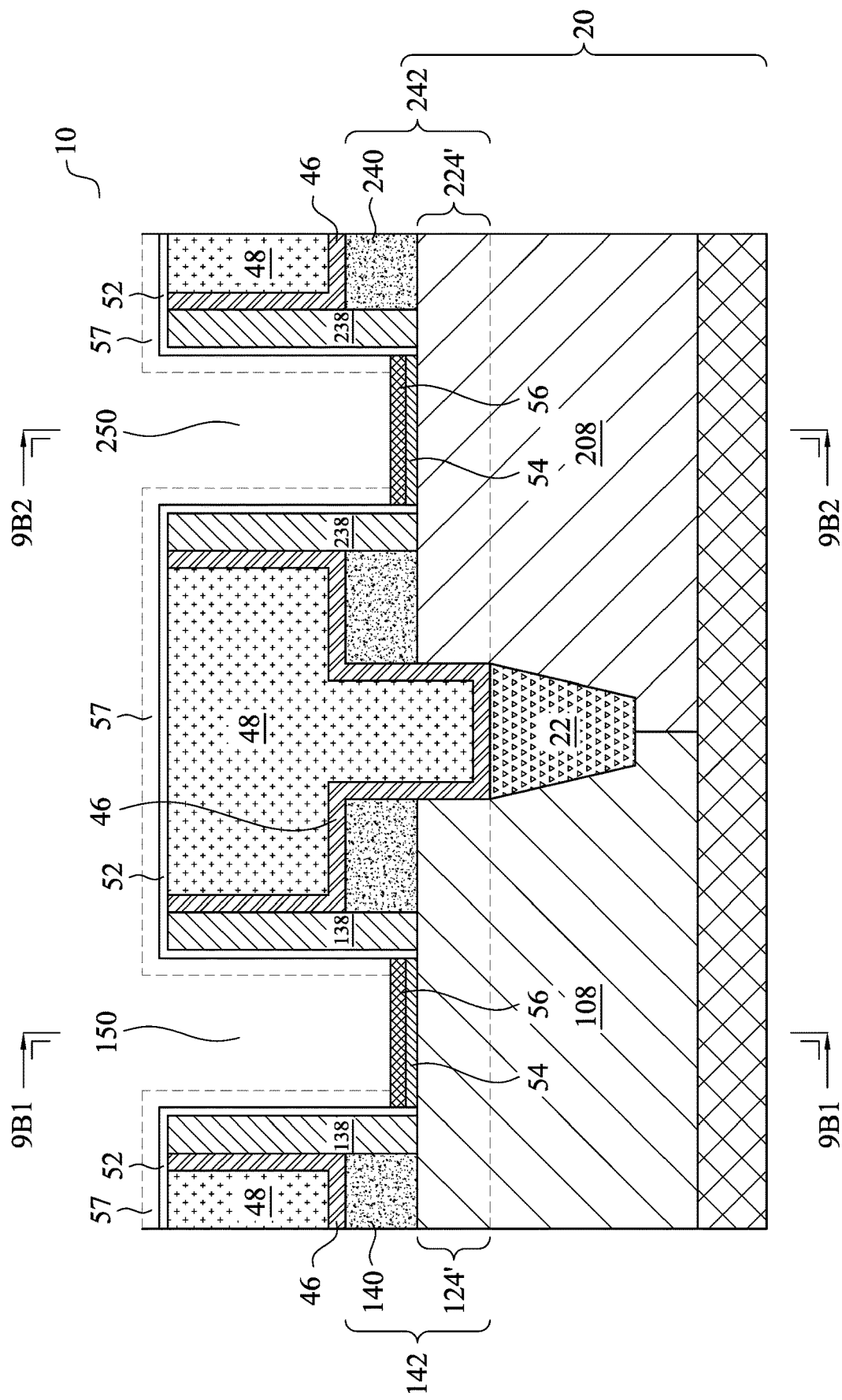
Figure 9B:
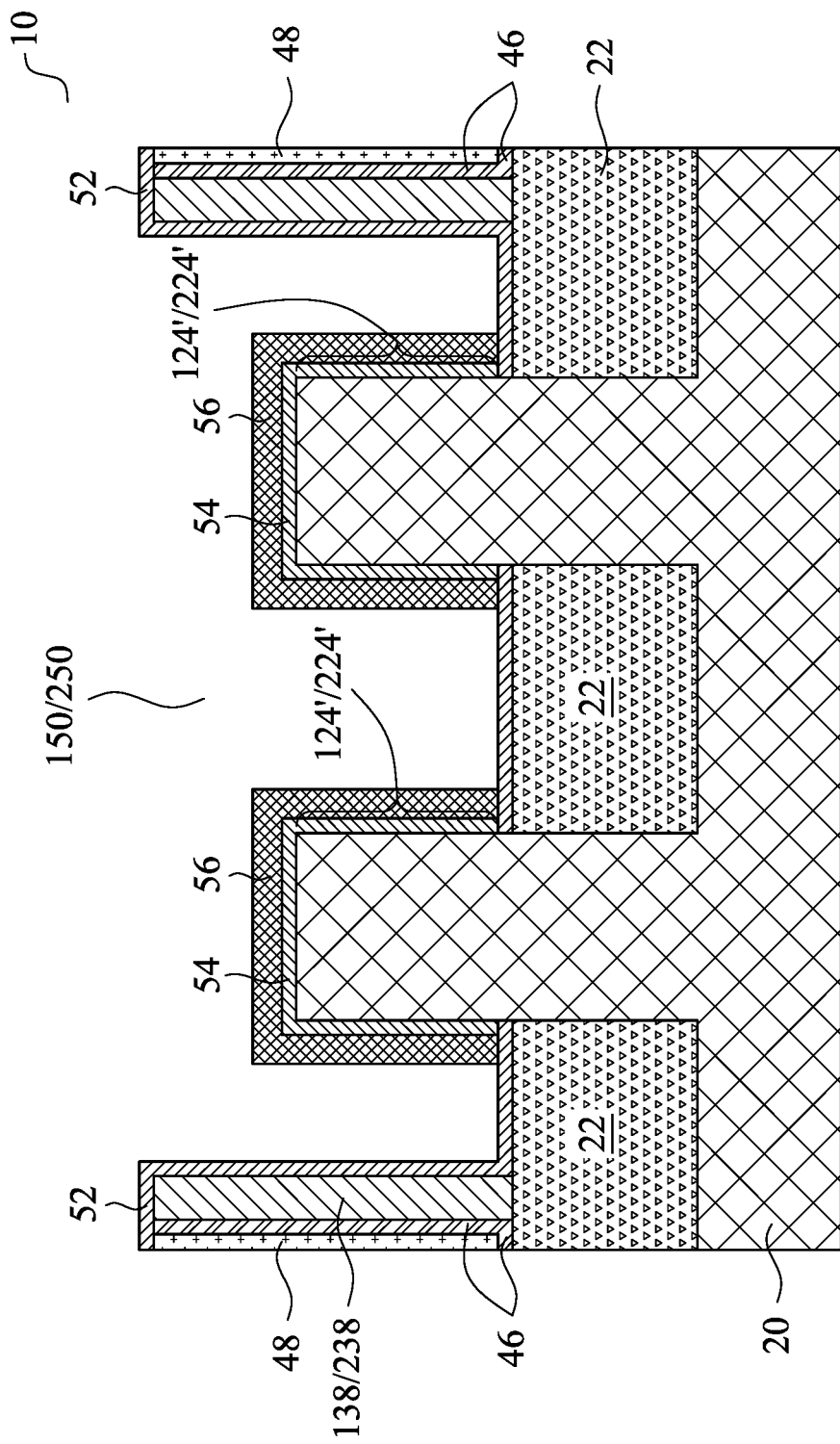

FIGS. 9A and 9B illustrate the cross-sectional view of wafer 10 after high-k gate dielectric 56 is formed. The respective step is illustrated as step 316 in the process flow shown in FIG. 15. Also, FIG. 9B is obtained from the vertical plane containing line 9B1-9B1 or 9B2-9B2 in FIG. 9A, with the vertical planes being perpendicular to the lengthwise direction of protruding fins 124' and 224'. Accordingly, FIG. 9B represents both the cross-sectional view cutting through protruding fin 124' and the cross-sectional view cutting through protruding fin 224'. In accordance with some embodiments of the present disclosure, high-k gate dielectric 56 includes high-k dielectric materials such as $HfO_2$, $ZrO_2$, HfZrOx, HfSiOx, HfSiON, ZrSiOx, HfZrSiOx, $Al_2O_3$, HfAlOx, HfAlN, ZrAlOx, $La_2O_3$, $TiO_2$, $Yb_2O_3$, or the like. High-k gate dielectric 56 may be a single layer or a composite layer including more than one layer. In accordance with some exemplary embodiments, the formation is performed using a process gas including $HfCl_4$ and $O_3$. The formation may be performed at a temperature in the range between about 250° C. and about 350° C. The formation method may include Atomic Layer Deposition (ALD). The thickness of high-k gate dielectric 56 may be in the range between about 0.5 nm and about 3 nm.

Due to the existence of inhibitor film 52, the deposition of high-k gate dielectric 56 is selective. For example, high-k gate dielectric 56 is selectively formed on IL 54, and not on inhibitor film 52, which prohibits the growth of high-k gate dielectric 56. Accordingly, as shown in FIGS. 9A and 9B, high-k gate dielectric 56 grows on the top surface and sidewalls (FIG. 9B) of protruding fins 124' and 224' (with IL 54 therebetween), and not on the sidewalls and top surfaces of gate spacers 138 and 238. For example, dashed line 57 (FIG. 9A) schematically illustrates the positions where high-k gate dielectric 56 will extend if high-k gate dielectric 56 is a blanket layer, rather than formed selectively. In accordance with some embodiments of the present disclosure, by forming high-k gate dielectric 56 selectively, the spaces marked by regions 57 are provided for forming replacement gate electrodes. Also, as shown in FIG. 9B, high-k gate dielectric 56 is also not grown over STI region 22.

Figure 10:
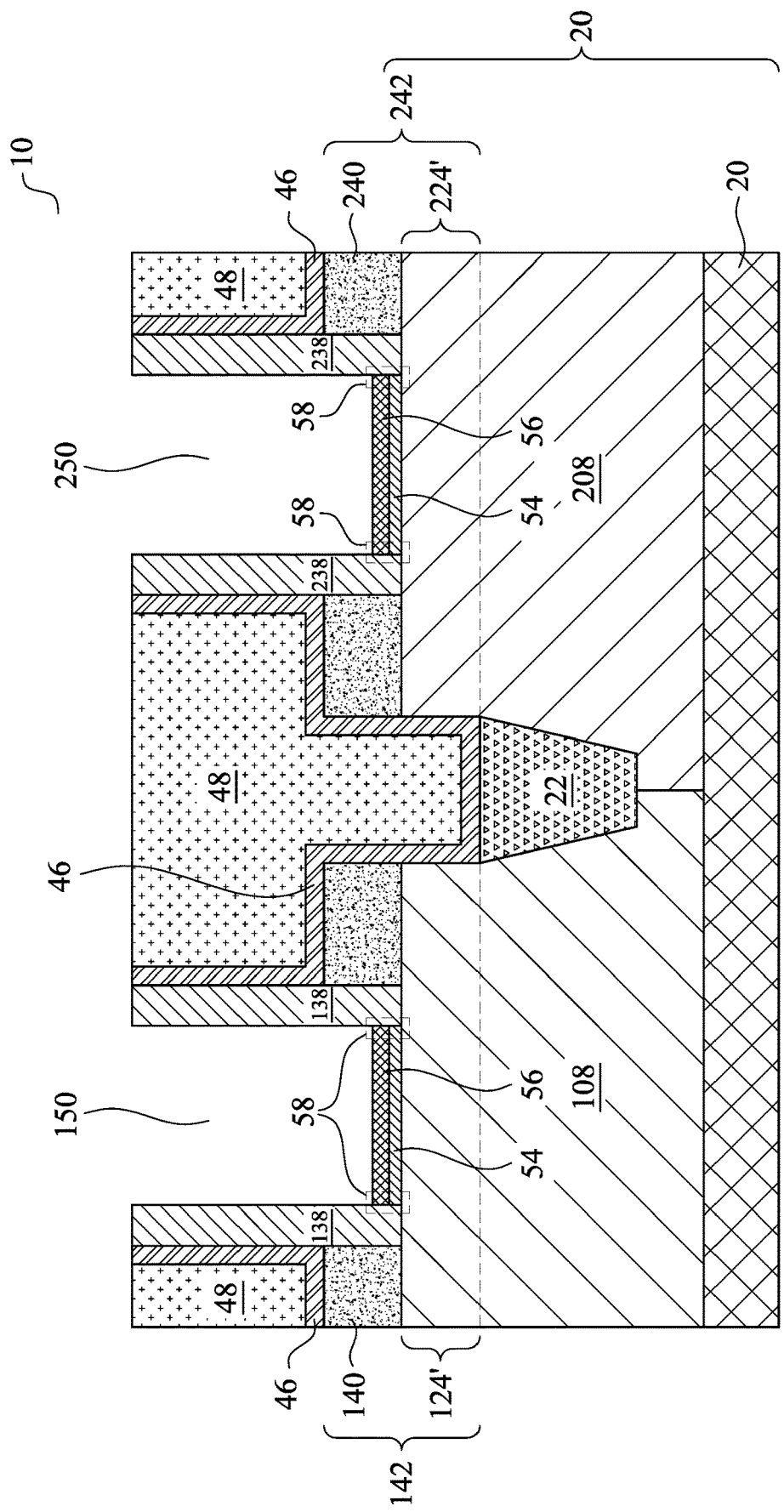
Figure 14:
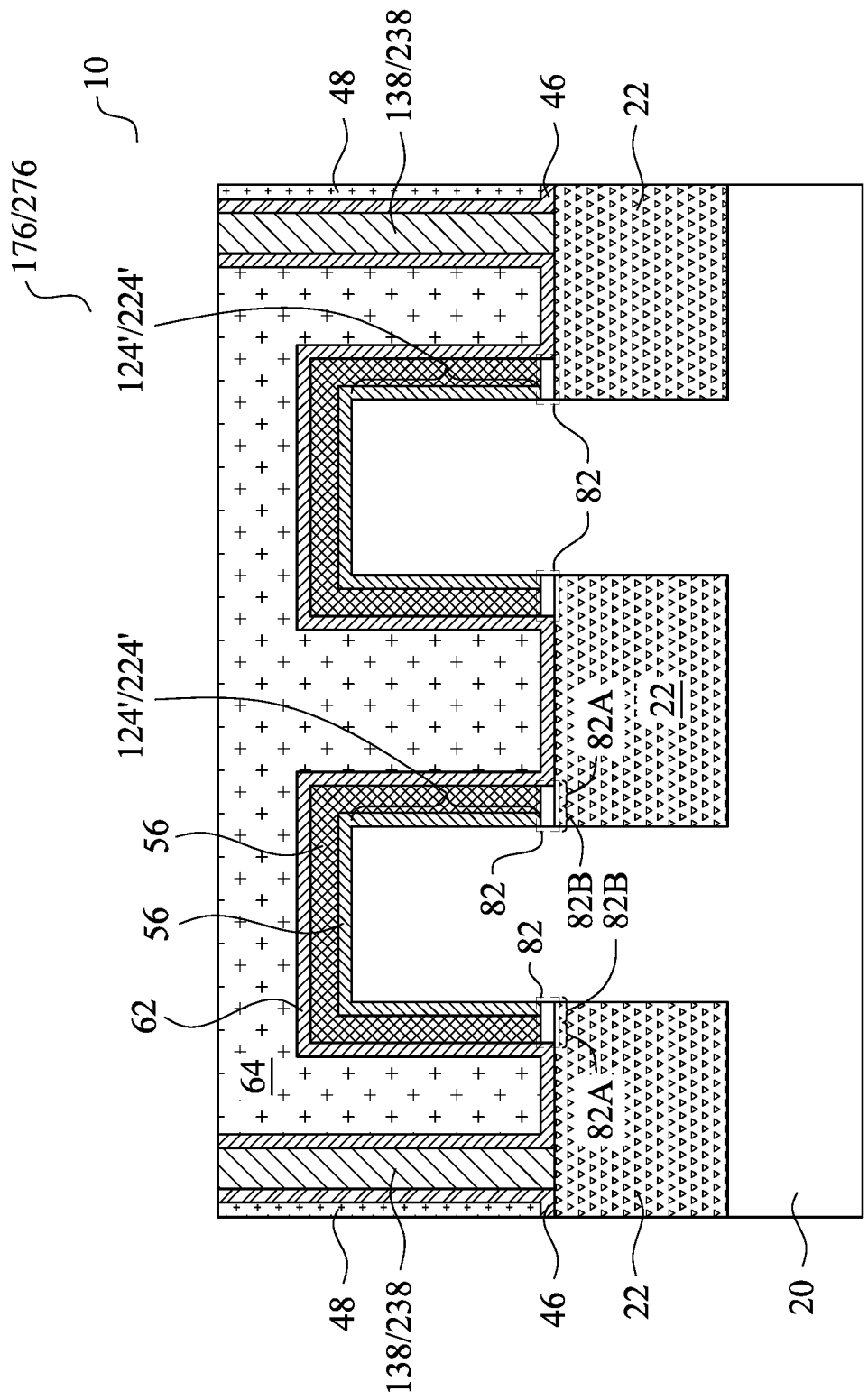
FIG. 14 shows a cross-sectional view of a FinFET in accordance with some embodiments.

In accordance with some embodiments of the present disclosure, after high-k gate dielectric 56 is formed, inhibitor film 52 is removed, and the resulting structure is shown in FIG. 10 (also refer to the FIG. 14). The respective step is illustrated as step 318 in the process flow shown in FIG. 15. In accordance with some embodiments of the present disclosure, the removal of inhibitor film 52 is performed by heating wafer 10 to a temperature at which inhibitor film 52 is decomposed. For example, the temperature may be higher than about 200° C. or higher than about 300° C. In accordance with some embodiments of the present disclosure, the temperature is in the range between about 200° C. and about 600° C., and may be in the range between about 250° C. and about 450° C. The heating process may last for a period of time between about 1 minute and about 60 minutes. In accordance with alternative embodiments of the present disclosure, the removal of inhibitor film 52 is performed through an etching process using an etchant attacking inhibitor film 52, and does not attack high-k gate dielectric 56, gate spacers 138 and 238, CESL 46, and ILD 48. The etching may be performed through dry etching or wet etching. For example, in accordance with some embodiments of the present disclosure in which wet etching is used, the etchant includes $H_3PO_4$, $H_2SO_4$, HCl, or the like as the etching solution. In accordance with some embodiments in which dry etching is used, HBr or the like may be used as the etching gas.

Depending on the material, the removal method, and the removal process, several results may occur. For example, FIG. 10 illustrates regions 58, which are the regions where the bottom portions of inhibitor film 52 used to occupy. After the removal of inhibitor film 52, regions 58 may be occupied by the materials of gate spacers 138/238, IL 54 and/or high-k gate dielectric 56. This may occur when inhibitor film 52 is thin, and inhibitor film 52 is removed through thermal removal, and hence no residue is left. The expansion and the migration of materials surrounding regions 58 cause the voids (in regions 58) left by the removed inhibitor film 52 to be filled.

Figure 13A:
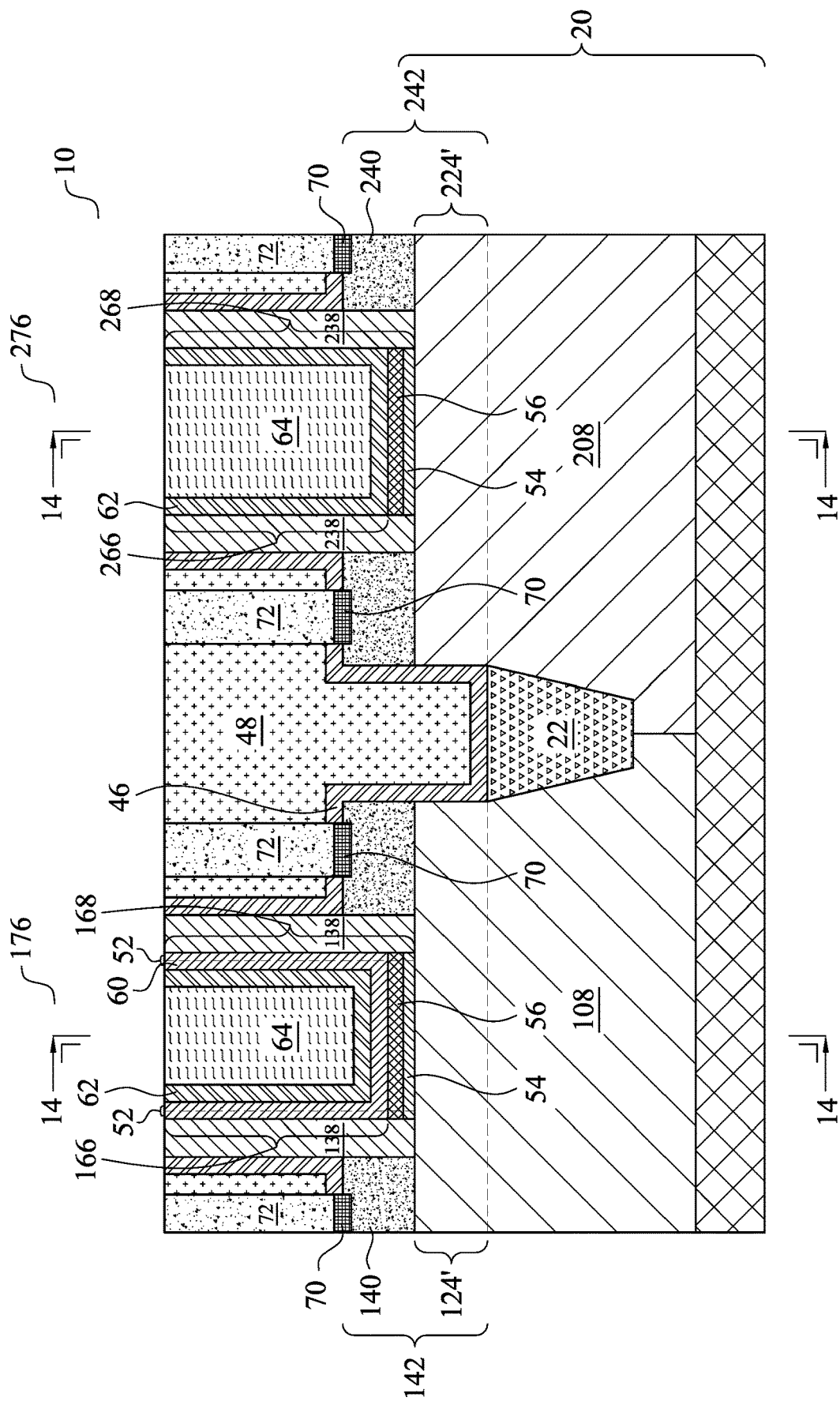
Figure 13B:
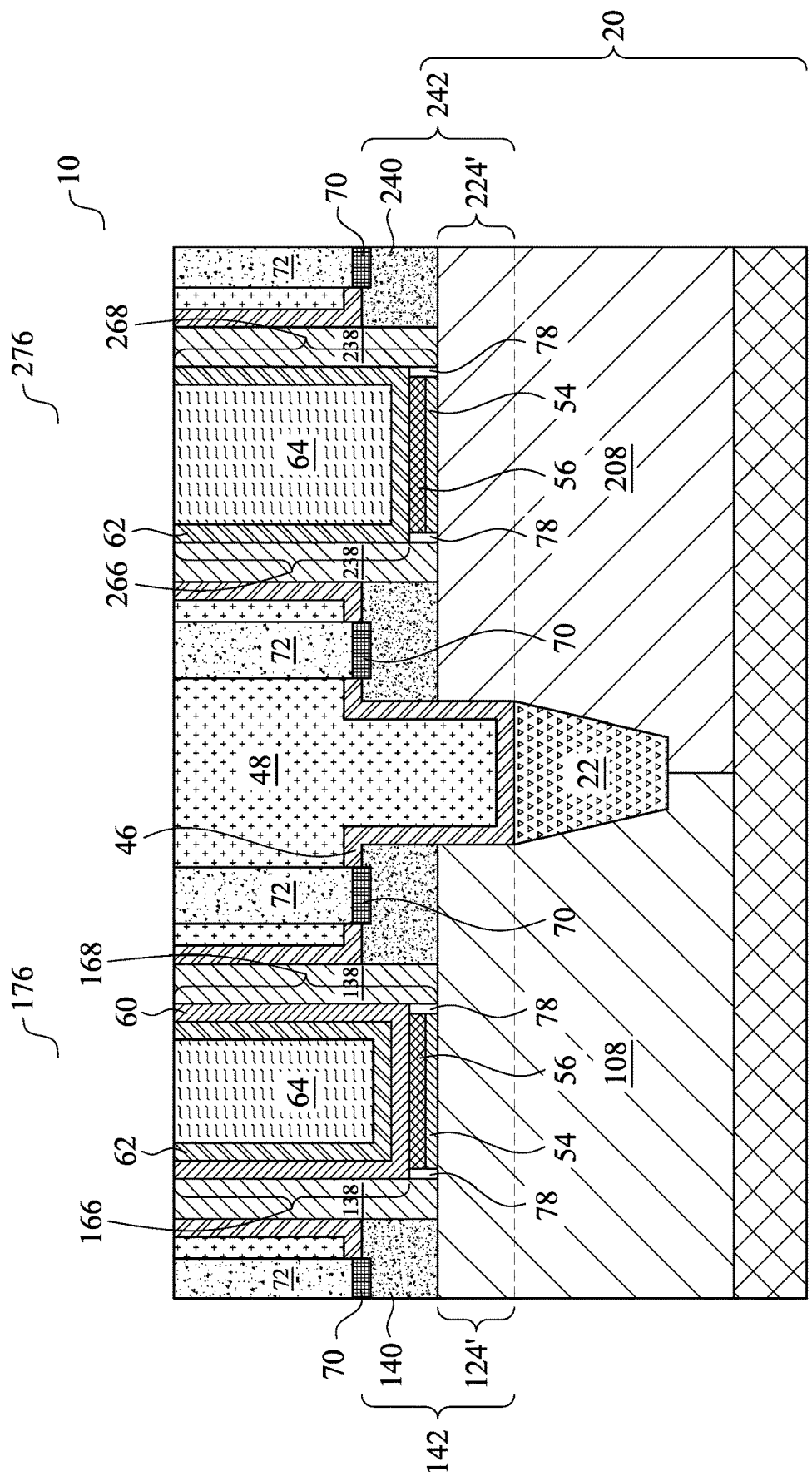
FIGS. 13B, 13C, and 13D are cross-sectional views of FinFETs in accordance with some embodiments.
Figure 13C:
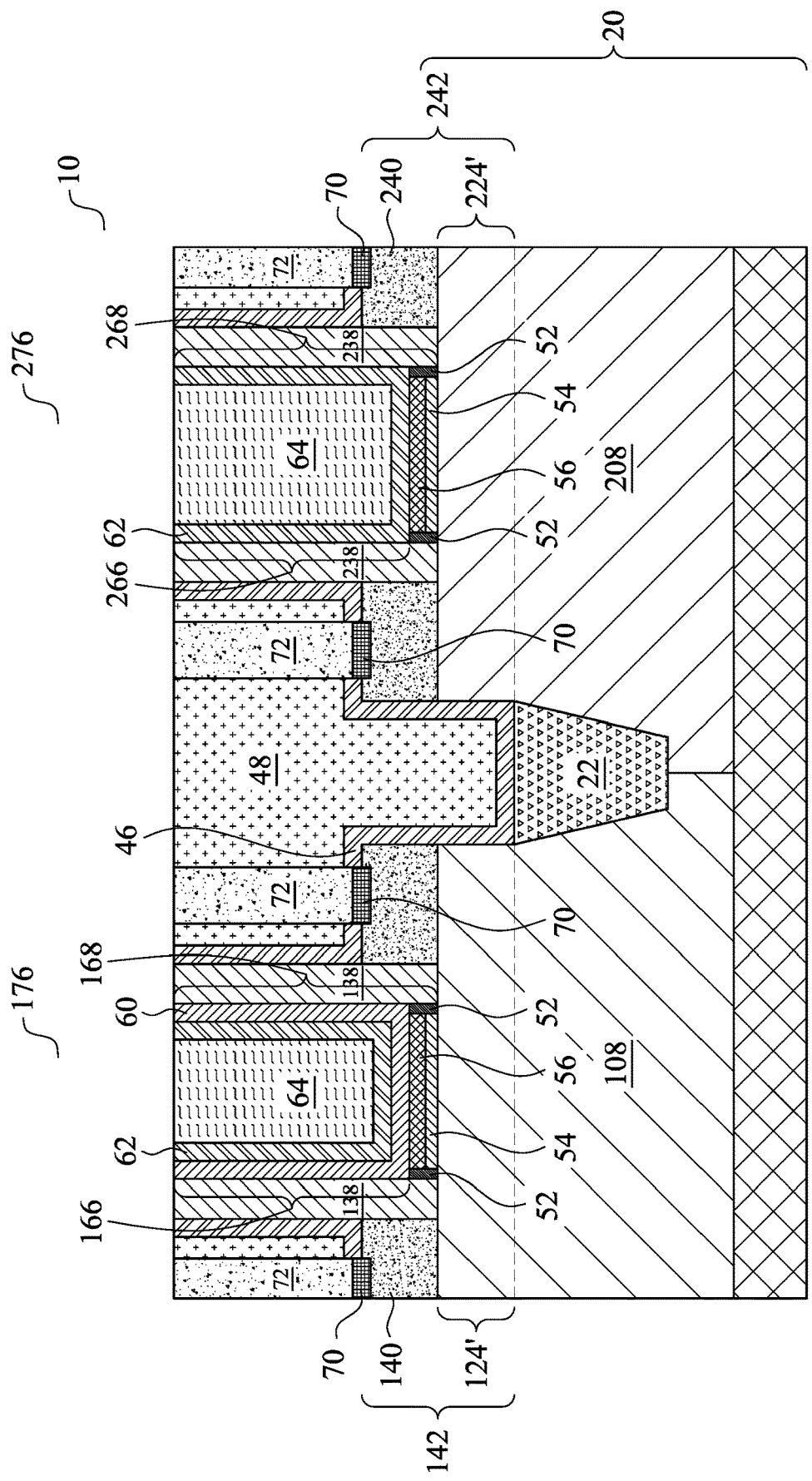

Regions 58 may also form voids that remain in the final FinFETs. Exemplary voids are schematically illustrated in FIG. 13B as voids 78. Furthermore, the structure shown in FIG. 13C is also the resulting structure with voids formed, except voids are partially filled with the metallic material of metal gate electrodes, which are formed in subsequent process steps.

Referring again to FIG. 10, regions 58 may also include the residue portions of inhibitor film 52, which residue portions are not removed in the removal step. For example, when etching is used to remove inhibitor film 52, the etchant may not be able to reach the corners (or penetrate into the gaps between) gate spacers 138/238 and the corresponding IL 54 and high-k gate dielectric layer 56, and hence some bottom portions of inhibitor film 52 are left. The top surfaces of the remaining inhibitor film 52 may be higher than, level with, or lower than, the top surfaces of high-k gate dielectric layer 56.

In accordance with alternative embodiments of the present disclosure, inhibitor film 52 is not removed, and is left in the final FinFETs. The resulting structure is shown in FIG. 13A, with dashed lines representing the unremoved inhibitor film 52.

Figure 11:
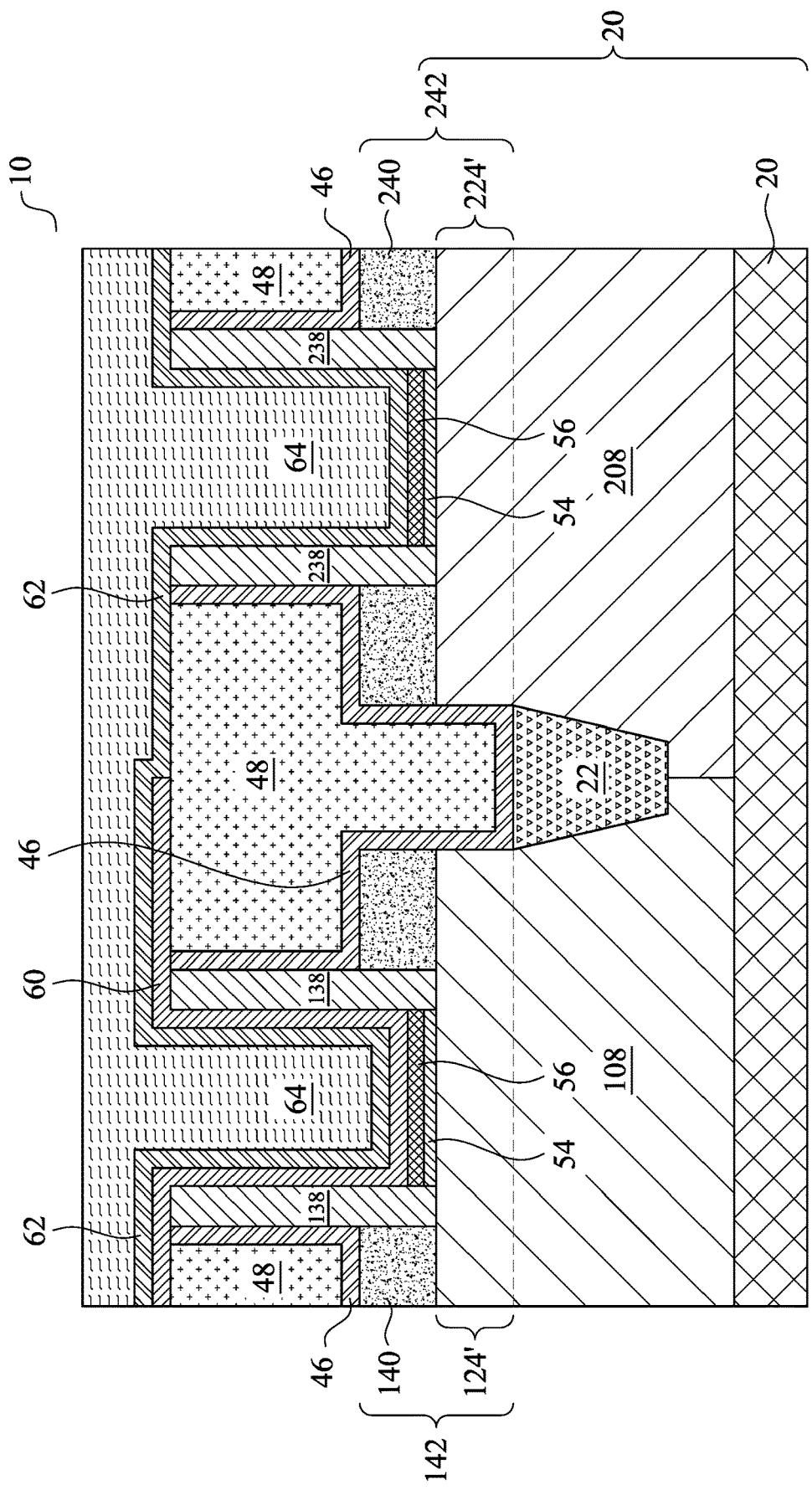

Referring further to FIG. 11, stacked layers 60 and 62 are deposited as blanket layers, which extend into openings 150 and 250 (FIG. 10). The respective step is illustrated as step 320 in the process flow shown in FIG. 15. Each of the stacked layers 60 and 62 may include a plurality of sub-layers. The sub-layers in stacked layers 60 and 62 are not shown separately, while the sub-layers may be distinguishable from each other. The deposition may be performed using conformal deposition methods such as ALD or CVD, so that the thicknesses of the vertical portions and the thicknesses of the horizontal portions of stacked layers 60 and 62 (and each of sub-layers) are substantially equal to each other. Stacked layers 60 and 62 include some portions over ILD 48.

Each of stacked layers 60 and 62 may include a diffusion barrier layer and one (or more) work-function layer over the diffusion barrier layer. The diffusion barrier layer may be formed of titanium nitride (TiN), which may (or may not) be doped with silicon. The work-function layer determines the work function of the respective gate, and includes at least one layer, or a plurality of layers formed of different materials. The material of the work-function layer is selected according to whether the respective FinFET is an n-type FinFET or a p-type FinFET. For example, for the p-type FinFET formed in device region 100, the work-function layer in stacked layer 60 may include Ti, Al, TiAl, TiAlN, Ta, TaN, TiAlC, TaAlCSi, TaAlC, TiSiN, or the like. An exemplary stacked work function layer in layer 60 includes a TaN layer, a TiN layer over the TaN layer, and a TiAl layer over the TiN layer. For the n-type FinFET formed in device region 200, the work-function layer in stacked layer 62 may include TiN, TaN, TiAl, W, Ta, Ni, Pt, or the like. An exemplary stacked work function layer in layer 62 includes a TaN layer and a TiAl layer over the TaN layer. After the deposition of the work-function layer(s), a barrier layer, which may be another TiN layer, is formed, which layer is included in stacked layer 62 in an exemplary embodiment.

In the exemplary embodiment as shown in FIG. 11, the formation process of stacked layers include blanket depositing stacked layers 60, which includes work function metals for p-type transistors, patterning stacked layers 60 to remove the portions in device region 200, and then blanket depositing stacked layers 62, so that stacked layers 62 have portions overlapping stacked layers 60. The work function of the transistor in device region 100 is mainly determined by stacked layers 60, and the work function of the transistor in device region 200 is mainly determined by stacked layers 62.

Figure 12:
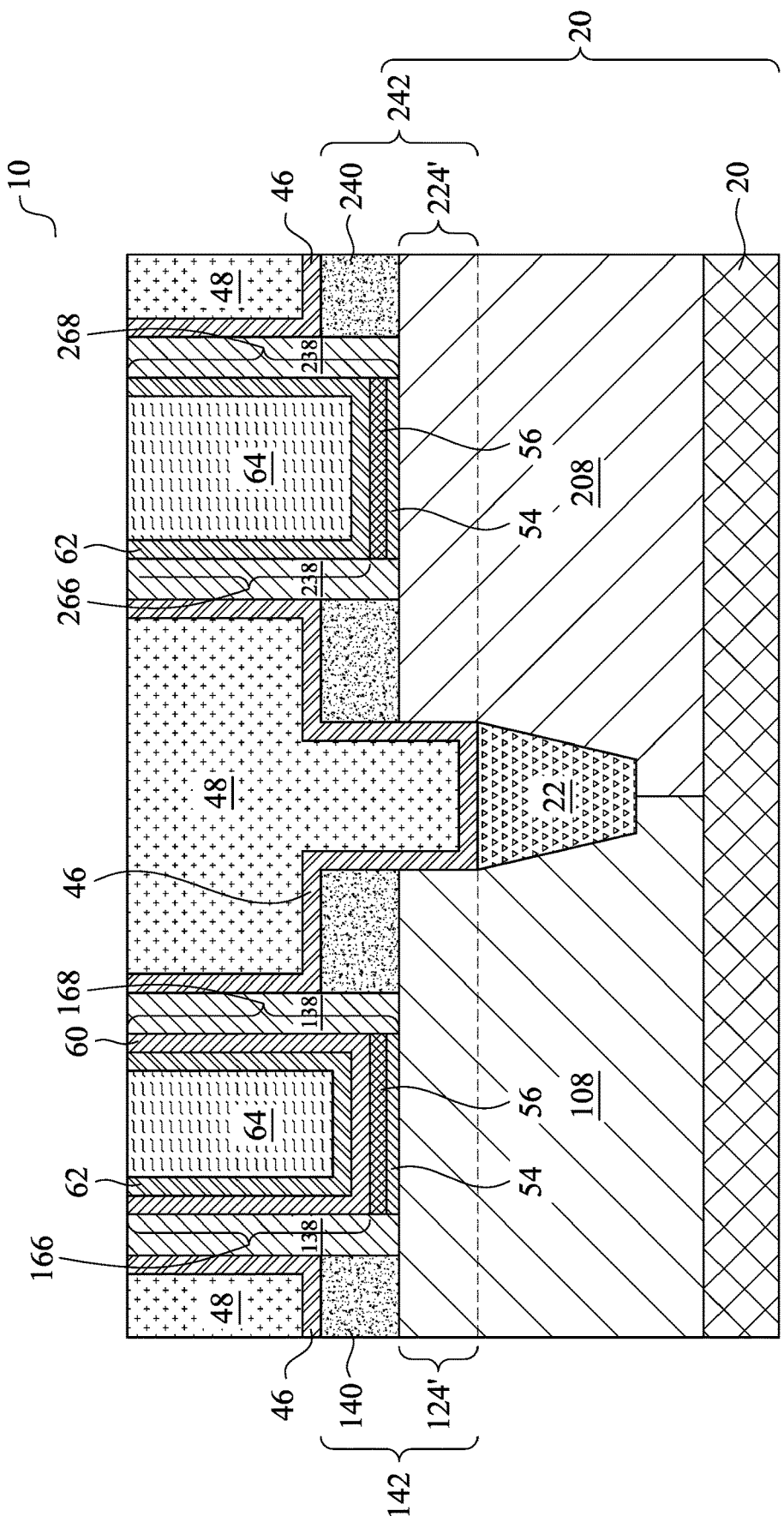

Next, as also shown in FIG. 11, metallic material 64 is deposited, which may be formed of tungsten, cobalt, copper, or the like. The respective step is also illustrated as step 320 in the process flow shown in FIG. 15. Metallic material 64 fully fills remaining openings 150 and 250 (FIG. 10). In a subsequent step as shown in FIG. 12, a planarization step such as CMP or mechanical grinding is performed, so that the portions of layers 60, 62, and 64 over ILD 48 are removed. As a result, replacement metal gate electrodes 166 and 266 are formed, which include the remaining portions of layers 60, 62, and 64. The respective step is illustrated as step 322 in the process flow shown in FIG. 15. Replacement metal gate electrodes 166 and 266 in combination with the underlying IL 54 and high-k gate dielectric 56 are referred to as replacement gate stacks 168 and 268, respectively.

As shown in FIG. 12, high-k gate dielectric layers 56 do not have portions on the sidewalls of gate spacers 138 and 238. This is different from the high-k gate dielectric layers in conventional replacement gates. As a result, replacement gate electrodes 166 and 266 are in contact with the sidewall surfaces of gate spacers 138 and 238.

FIG. 13A illustrates the formation of source/drain silicide region 70 and source/drain contact plugs 72. The respective step is illustrated as step 324 in the process flow shown in FIG. 15. In accordance with some embodiments of the present disclosure, ILD 48 and CESL 46 are etched to form contact openings. Silicide regions may be formed in preceding steps as shown in FIG. 4B, and are shown as silicide regions 144 and 244. Alternatively, silicide regions are formed after the formation of replacement gates. For example, after the formation of contact openings, a metal layer (not shown) is deposited as a blanket layer and extending into the contact openings, followed by a nitridation process on the top portion of the metal layer to form a metal nitride layer. The metal layer may be formed of Ti, Co, Ni, NiCo, Pt, Ni(Pt), Ir, Pt(Ir), Er, Yb, Pd, Rh, Nb, or alloys thereof. The bottom portion of the metal layer is not nitridated. Next, an anneal (which may be rapid thermal anneal) is performed to react the metal layer with the top portion of source/drain regions 142 and 242 to form silicide regions 70. The portions of the metal layer on the sidewalls of ILD 48 are not reacted. Next, either the previously formed metal nitride layer is left as a conductive barrier, or the previously formed metal nitride layer is removed, followed by the deposition of a new metal nitride layer (such as titanium nitride). The remaining contact openings are then filled with a metal such as tungsten, cobalt, copper, or the like, followed by a planarization to remove excess materials, resulting in source/drain contact plugs 72. P-type FinFET 176 and n-type FinFET 276 are thus formed.

In accordance with some embodiments of the present disclosure, inhibitor film 52 is not removed, and hence remains in P-type FinFET 176 and n-type FinFET 276, as illustrated by dashed lines. Inhibitor film 52, if not removed, is between and contacting spacers 138/238 and the corresponding gate electrodes 166 and 266.

FIG. 13B illustrates p-type FinFET 176 and n-type FinFET 276 formed in accordance with some embodiments of the present disclosure. The voids formed in regions 58 (FIG. 10) are not filled by gate electrodes 166 and 266. Accordingly, voids 78 as shown in FIG. 13B remain in p-type FinFET 176 and/or n-type FinFET 276. It is realized that although FIG. 13B illustrates that voids 78 are on top of protruding fins 124' and 224', voids 78 may also follow the contour of protruding fins 124' and 224', and extend on the sidewalls of protruding fins 124' and 224'.

FIG. 13C illustrates p-type FinFET 176 and n-type FinFET 276 formed in accordance with some embodiments of the present disclosure. Inhibitor film 52 is not fully removed, and the residue portions are left. Inhibitor film 52 thus has residue portions remaining in p-type FinFET 176 and/or n-type FinFET 276. It is realized that although FIG. 13C illustrates that the residue portions of inhibitor film 52 is on the top of protruding fins 124' and 224', the residue portions may also follow the contour of protruding fins 124' and 224', and extend on the sidewalls of protruding fins 124' and 224'.

Figure 13D:
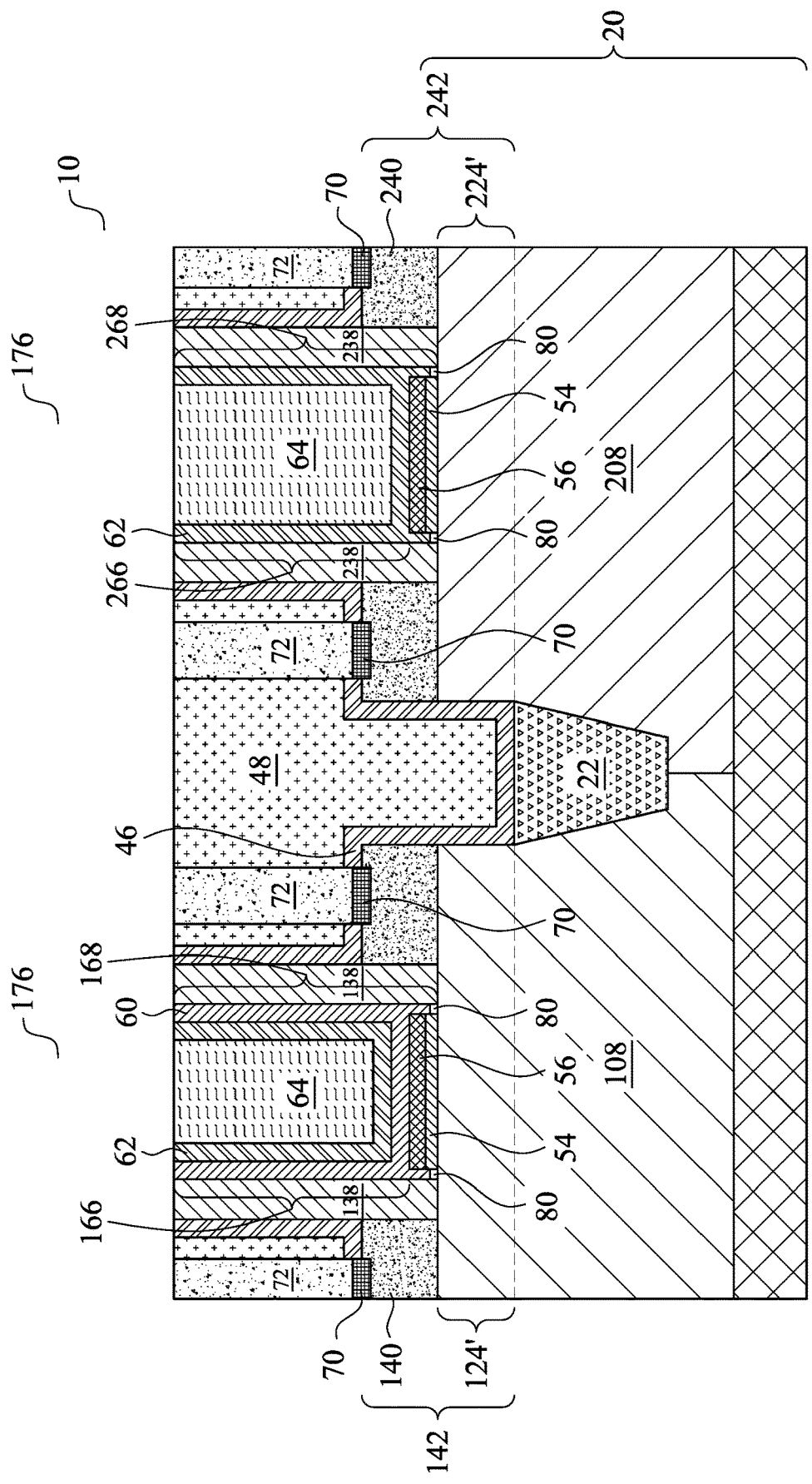

FIG. 13D illustrates p-type FinFET 176 and n-type FinFET 276 formed in accordance with some embodiments of the present disclosure. In accordance with these embodiments, layers 60 and/or 62 extend lower than the top surfaces of high-k gate dielectric 56, and partially fill the gaps between gate spacers 138/238 and layers 54 and 56. Regions 80 may be voids (air gaps or vacuum), or may be the residue portions of inhibitor film 52. It is realized that the partially filled regions and regions 80 may also follow the contour of protruding fins 124' and 224', and extend on the sidewalls of protruding fins 124' and 224'.

Also, the structures shown in FIGS. 13A, 13B, 13C, and 13D may exist on the same chip and same wafer in any combination. For example, some transistors may have layers 54 and 56 contacting gate spacers 138 and/or 238, as shown in FIG. 13A, while some other transistors on the same chip may have voids 78 in FIG. 13B, residue inhibitor film 52 in FIG. 13C, or have the structure in FIG. 13D.

FIG. 14 illustrates the cross-sectional view of FinFETs 176 and 276. The cross-sectional view may be obtained from the plane containing line 14-14 in device region 100 (refer to FIG. 13A, for example), or obtained from the plane containing line 14-14 in device region 200. Regions 82 in FIG. 14 may be voids (air gaps or vacuum), inhibitor film residue, or may be partially filled with stacked layers 60/62. For example, regions 82 may include portions 82A and 82B, wherein regions 82A may be voids, and regions 82B may include residues of inhibitor film 52 therein due to the incomplete removal of inhibitor film 52.

The embodiments of the present disclosure have some advantageous features. By selectively forming an inhibitor film, high-k gate dielectrics are selectively formed on protruding fins, and do not include sidewall portions on the sidewalls of gate spacers. The sidewall portions of the high-k gate dielectrics, if formed, would cause the adverse increase in the parasitic capacitance between neighboring gates and neighboring fins due to the high k value of the high-k gate dielectrics. Hence, selectively forming the high-k gate dielectrics results in the desirable reduction of the parasitic capacitance. In addition, by not forming the sidewall portions of the high-k gate dielectrics, the spaces that otherwise will be occupied by the sidewall portions of the high-k gate dielectrics are now provided for the formation of replacement gate electrodes. This is advantageous since with the reduction of the sizes of the gate electrodes, the gap-filling of multiple layers for forming the replacement gate electrodes have become increasingly more difficult.

In accordance with some embodiments of the present disclosure, a method includes removing a dummy gate stack to form an opening between gate spacers, selectively forming an inhibitor film on sidewalls of the gate spacers, with the sidewalls of the gate spacers facing the opening, and selectively forming a dielectric layer over a surface of a semiconductor region. The inhibitor film inhibits growth of the dielectric layer on the inhibitor film. The method further includes removing the inhibitor film, and forming a replacement gate electrode in a remaining portion of the opening. In an embodiment, the method further includes forming a dielectric interfacial layer on exposed surfaces of the semiconductor region, wherein the dielectric layer is over and contacts the dielectric interfacial layer. In an embodiment, the dielectric interfacial layer is formed after the inhibitor film is formed. In an embodiment, the removing the inhibitor film comprises a thermal treatment. In an embodiment, the inhibitor film is formed using a Si—Cl based precursor. In an embodiment, the inhibitor film is formed using a Si—N based precursor. In an embodiment, the forming the inhibitor film comprises thermally treating a respective wafer comprising the gate spacers and the semiconductor region in a process gas. In an embodiment, after the inhibitor film is removed, a gap is formed between the dielectric layer and a closest edge of the gate spacers, and after the replacement gate electrode is formed, the gap remains. In an embodiment, after the inhibitor film is removed, a residue portion of the inhibitor film remains, and after the replacement gate electrode is formed, the residue portion is underlying the replacement gate electrode.

In accordance with some embodiments of the present disclosure, a method includes removing a dummy gate stack to form an opening between gate spacers, wherein a surface of a semiconductor region is exposed to the opening; forming a dielectric interfacial layer contacting the surface of the semiconductor region; in a deposition process, selectively depositing a high-k dielectric layer over and contacting the dielectric interfacial layer, wherein the high-k dielectric layer, as deposited, is free from portions on sidewalls of the gate spacers; and forming a replacement gate electrode in a remaining portion of the opening. In an embodiment, the method further includes forming an inhibitor film contacting sidewalls of the gate spacers, wherein during the forming the high-k dielectric layer, the inhibitor film inhibits growth of the high-k dielectric layer on the inhibitor film. In an embodiment, the method further includes removing the inhibitor film before the replacement gate electrode is formed. In an embodiment, the replacement gate electrode is formed to contact sidewalls of the inhibitor film. In an embodiment, the forming the replacement gate electrode comprises depositing a work function metal layer, and at a time the work function metal layer is deposited, an entirety of the high-k dielectric layer is lower than top surfaces of the gate spacers.

In accordance with some embodiments of the present disclosure, a device includes a semiconductor region; a gate spacer over the semiconductor region, and a gate stack over the semiconductor region. The gate stack comprises a dielectric interfacial layer over the semiconductor region; a high-k gate dielectric comprising a horizontal portion overlapping the dielectric interfacial layer, wherein the high-k gate dielectric is free from portions on sidewalls of the gate spacer, and the horizontal portion of the high-k gate dielectric is spaced apart from the gate spacer; and a conductive gate electrode over the high-k gate dielectric, wherein the conductive gate electrode contacts the gate spacer. The conductive gate electrode has a sub-layer comprising a bottom portion, and sidewall portions connected to opposite ends of the bottom portion, wherein the sidewall portions are higher than the bottom portions. In an embodiment, the high-k gate dielectric is spaced apart from the gate spacer by an air gap. In an embodiment, the air gap comprises a portion extending between, and at a same level as, the dielectric interfacial layer and the gate spacer. In an embodiment, the high-k gate dielectric is spaced apart from the gate spacer by an inhibitor film, and the inhibitor film is formed of a material different from materials of the gate spacer, the dielectric interfacial layer, and the high-k gate dielectric. In an embodiment, the inhibitor film has a first edge contacting a sidewall of the gate spacer, and a second edge contacting an edge of the high-k gate dielectric, and the first edge and the second edge are opposite edges of the inhibitor film. In an embodiment, the inhibitor film comprises silicon and a functional group selected from the group consisting of $CH_3$, $CH_2$, and $CF_2$.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    removing a dummy gate stack to form an opening between gate spacers;
    selectively forming an inhibitor film on sidewalls of the gate spacers, wherein the sidewalls of the gate spacers face the opening;
    selectively forming a dielectric layer over a surface of a semiconductor region, wherein the inhibitor film inhibits growth of the dielectric layer on the inhibitor film;
    removing the inhibitor film; and
    forming a replacement gate electrode in a remaining portion of the opening.

2. The method of claim 1 further comprising:
    forming a dielectric interfacial layer on exposed surfaces of the semiconductor region, wherein the dielectric layer is over and contacts the dielectric interfacial layer.

3. The method of claim 2, wherein the dielectric interfacial layer is formed after the inhibitor film is formed.

4. The method of claim 1, wherein the removing the inhibitor film comprises a thermal treatment.

5. The method of claim 1, wherein the inhibitor film is formed using a Si—Cl based precursor.

6. The method of claim 1, wherein the inhibitor film is formed using a Si—N based precursor.

7. The method of claim 1, wherein the forming the inhibitor film comprises thermally treating a respective wafer comprising the gate spacers and the semiconductor region in a process gas at a temperature between about 50° C. and about 200° C.

8. The method of claim 1, wherein after the inhibitor film is removed, a gap is formed between the dielectric layer and a closest edge of the gate spacers, and after the replacement gate electrode is formed, the gap remains.

9. The method of claim 1, wherein after the inhibitor film is removed, a residue portion of the inhibitor film remains, and after the replacement gate electrode is formed, the residue portion is underlying the replacement gate electrode.

10. A method comprising:
    forming an opening between gate spacers, wherein a surface of a semiconductor region is exposed to the opening;
    forming an inhibitor film on sidewalls of the gate spacers, wherein the inhibitor film extends into the opening;
    forming a gate dielectric, wherein the gate dielectric extends into the opening to contact the semiconductor region;
    removing the inhibitor film; and
    forming a gate electrode in the opening.

11. The method of claim 10, wherein the inhibitor film is formed selectively on the sidewalls of the gate spacers, and the inhibitor film does not grow on the surface of the semiconductor region.

12. The method of claim 10, wherein the gate dielectric is formed selectively on the surface of the semiconductor region, and the inhibitor film inhibits growth of the gate dielectric on the inhibitor film.

13. The method of claim 10, wherein the inhibitor film is formed using a Si—Cl based precursor.

14. The method of claim 10, wherein the inhibitor film is formed using a Si—N based precursor.

15. The method of claim 10, wherein the forming the inhibitor film comprises thermally treating a respective wafer comprising the gate spacers and the semiconductor region in a process gas at a temperature between about 50° C. and about 200° C.

16. A method comprising:
    removing a dummy gate stack to form an opening between gate spacers;
    selectively forming an inhibitor film on sidewalls of the gate spacers, wherein the sidewalls of the gate spacers face the opening, wherein the inhibitor film is formed using a Si—Cl based precursor or a Si—N based precursor;
    selectively forming a high-k dielectric layer over a surface of a semiconductor region, wherein the inhibitor film inhibits growth of the high-k dielectric layer on the inhibitor film;
    removing the inhibitor film; and
    forming a replacement gate electrode in a remaining portion of the opening.

17. The method of claim 16 further comprising:
    forming a dielectric interfacial layer on exposed surfaces of the semiconductor region, wherein the high-k dielectric layer is over and contacts the dielectric interfacial layer.

18. The method of claim 17, wherein the dielectric interfacial layer is formed after the inhibitor film is formed.

19. The method of claim 16, wherein the removing the inhibitor film comprises a thermal treatment.

20. The method of claim 16, wherein after the inhibitor film is removed, a gap is formed between the high-k dielectric layer and a closest edge of the gate spacers, and after the replacement gate electrode is formed, the gap remains.

* * * * *